(12) United States Patent
Sasaki et al.

(10) Patent No.: US 11,600,866 B2
(45) Date of Patent: Mar. 7, 2023

(54) SEMICONDUCTOR SOLID STATE BATTERY

(71) Applicants: KABUSHIKI KAISHA TOSHIBA, Tokyo (JP); TOSHIBA MATERIALS CO., LTD., Yokohama (JP)

(72) Inventors: Atsuya Sasaki, Yokohama (JP); Akito Sasaki, Yokohama (JP); Yoshinori Kataoka, Kawasaki (JP); Hideaki Hirabayashi, Yokohama (JP); Shuichi Saito, Yokohama (JP)

(73) Assignees: Kabushiki Kaisha Toshiba, Tokyo (JP); Toshiba Materials Co., Ltd., Yokohama (JP)

( * ) Notice: Subject to any disclaimer, the term of this patent is extended or adjusted under 35 U.S.C. 154(b) by 890 days.

(21) Appl. No.: 16/437,459

(22) Filed: Jun. 11, 2019

(65) Prior Publication Data
US 2019/0296401 A1    Sep. 26, 2019

Related U.S. Application Data

(63) Continuation of application No. PCT/JP2017/046002, filed on Dec. 21, 2017.

(30) Foreign Application Priority Data

Dec. 21, 2016    (JP) .............................. JP2016-247739

(51) Int. Cl.
   *H01M 10/38*    (2006.01)
   *H01M 10/02*    (2006.01)
   *H01L 49/00*    (2006.01)

(52) U.S. Cl.
   CPC ............ *H01M 10/38* (2013.01); *H01L 49/00* (2013.01); *H01M 10/02* (2013.01)

(58) Field of Classification Search
   CPC .... H01M 10/38; H01M 10/02; H01M 10/052; H01M 10/0562; H01M 14/00;
   (Continued)

(56) References Cited

U.S. PATENT DOCUMENTS

2010/0330410 A1*  12/2010  Takahashi ........... H01M 10/052
                                                             429/129
2013/0224596 A1    8/2013  Nakazawa
(Continued)

FOREIGN PATENT DOCUMENTS

CN    103140933 A    6/2013
CN    104952962 A    9/2015
(Continued)

OTHER PUBLICATIONS

International Search Report and Written Opinion (Application No. PCT/JP2017/046002) dated Mar. 13, 2018.

*Primary Examiner* — Caleen O Sullivan
(74) *Attorney, Agent, or Firm* — Burr Patent Law, PLLC

(57) ABSTRACT

A semiconductor solid state battery has an insulating layer provided between an N-type semiconductor and a P-type semiconductor. The first insulating layer preferably has a thickness of 3 nm to 30 μm and a dielectric constant of 10 or less. The first insulating layer preferably has a density of 60% or more of a bulk body. The semiconductor layer preferably has a capture level introduced. The semiconductor solid state battery can eliminate leakage of an electrolyte solution.

20 Claims, 4 Drawing Sheets

(58) Field of Classification Search
CPC .......... H01M 4/386; H01M 4/48; H01M 4/58; H01M 50/431; H01L 49/00; Y02E 60/10; Y02P 70/50
USPC ........................................................ 257/288
See application file for complete search history.

(56) References Cited

U.S. PATENT DOCUMENTS

2015/0270329 A1      9/2015   Sagara et al.
2019/0190024 A1*    6/2019   Tonokawa .............. H01M 4/48

FOREIGN PATENT DOCUMENTS

| JP | 2001-338649 | A1 | 12/2001 |
| JP | 2014-154223 | A1 | 8/2014 |
| JP | 2015-195335 | A1 | 11/2015 |
| JP | 2016-014128 | A1 | 1/2016 |
| KR | 10-1605765 | B1 | 3/2016 |
| WO | 2012/046325 | A1 | 4/2012 |

* cited by examiner

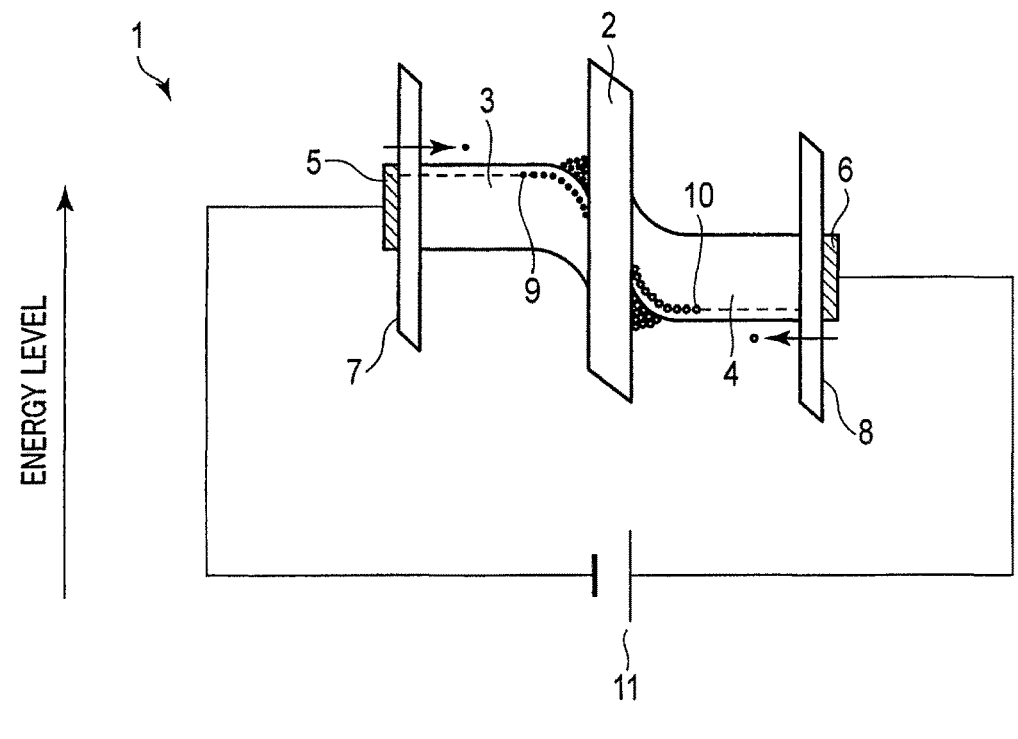
F I G. 6
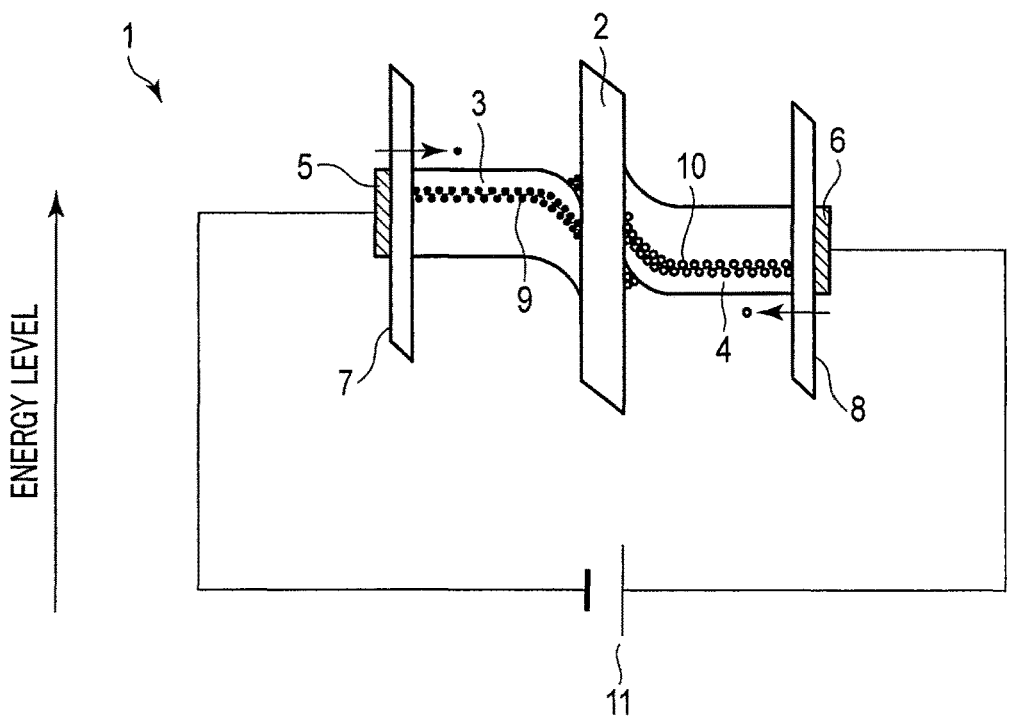
F I G. 7

SEMICONDUCTOR SOLID STATE BATTERY

CROSS-REFERENCE TO RELATED APPLICATION

This application is a Continuation application of PCT Application No. PCT/JP2017/046002, filed Dec. 21, 2017 and based upon and claiming the benefit of priority from Japanese Patent Application No. 2016-247739, filed Dec. 21, 2016, the entire contents of all of which are incorporated herein by reference.

FIELD

The embodiments described herein relate generally to a semiconductor solid state battery.

BACKGROUND

In recent years, efficient use of electricity is required from the viewpoint of the spread of electric devices and energy saving. In accordance with this, development of secondary batteries capable of charging and discharging electricity is in progress. As secondary batteries, various secondary batteries, such as Li ion secondary batteries, lead-storage batteries, and nickel-hydrogen storage batteries, have been developed. For example, Jpn. Pat. Appln. KOKAI Publication No. 2001-338649 discloses a Li ion secondary battery using a Li composite oxide as a positive electrode active material. The Li ion secondary battery is utilized as a battery for electric devices because miniaturization is also possible.

On the other hand, the Li ion secondary battery has a structure in which Li ions are taken in and out through an electrolyte solution. Therefore, the Li ion secondary battery is a battery that requires an electrolyte solution. Similarly, the lead-storage battery and the nickel-hydrogen storage battery are batteries that require an electrolyte solution. Leakage of the electrolyte solution may cause fire or explosion. Therefore, the Li ion secondary battery has a sealed structure so that leakage would not occur. However, there has been a problem where leakage had occurred because of deterioration due to long-term use, the manner of usage of electric devices, and the use environment.

Semiconductor solid state batteries have been developed so as to eliminate such problems caused by leakage. Semiconductor solid state batteries trap electrons at energy levels and perform charge. There is no need to use an electrolyte solution because there can be implemented a secondary battery that is all-solid.

An example of a semiconductor solid state battery is disclosed in Jpn. Pat. Appln. KOKAI Publication No. 2014-154223.

BRIEF DESCRIPTION OF THE DRAWINGS

FIG. 6 is a schematic view showing movement of electrons and holes of a semiconductor solid state battery according to another example of the embodiment;

FIG. 7 is a schematic view showing movement of electrons and holes of a semiconductor solid state battery according to still another example of the embodiment.

DETAILED DESCRIPTION

The semiconductor solid state battery of Jpn. Pat. Appln. KOKAI Publication No. 2014-154223 has a structure obtained by forming as a charge layer a thin film, in which a metal oxide semiconductor and an insulating material are mixed, and providing plural of pairs of electrodes on the charge layer. In Jpn. Pat. Appln. KOKAI Publication No. 2014-154223, this structure is intended to improve the degree of freedom in designing an output voltage and/or a discharge capacity.

However, further improvement is in demand. Embodiments have been prepared for solving such problems, and the embodiments provide a semiconductor solid state battery with improved output voltage and/or discharge capacity.

A semiconductor solid state battery according to one embodiment includes an N-type semiconductor, a P-type semiconductor, and an insulating layer. The insulating layer is provided between the N-type semiconductor and the P-type semiconductor.

Figure 1:
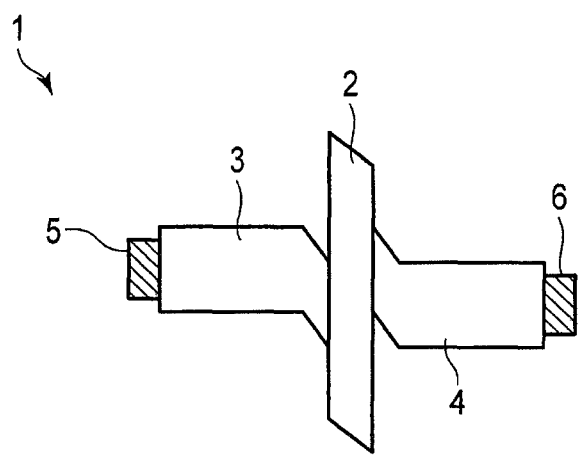
FIG. 1 is a schematic view of a semiconductor solid state battery according to an embodiment.

The semiconductor solid state battery according to the embodiment has a first insulating layer provided between an N-type semiconductor and a P-type semiconductor. FIG. 1 shows a schematic view of a semiconductor solid state battery according to an embodiment. In FIG. 1, reference numeral 1 denotes a semiconductor solid state battery, reference numeral 2 denotes a first insulating layer, reference numeral 3 denotes an N-type semiconductor, reference numeral 4 denotes a P-type semiconductor, reference numeral 5 denotes a first electrode (N-type side electrode), and reference numeral 6 denotes a second electrode (P-type side electrode).

First, the first insulating layer 2 is provided between the N-type semiconductor 3 and the P-type semiconductor 4. Recombination of electrons and holes in the N-type semiconductor 3 and the P-type semiconductor 4 can be suppressed by providing the first insulating layer 2. Self-discharge is suppressed by suppressing recombination of electrons and holes. Thereby, storage capacity can be increased.

The thickness of the first insulating layer 2 is preferably 3 nm to 30 µm. When the thickness of the first insulating layer 2 is less than 3 nm, the insulating layer is too thin, and thus the electron-hole recombination suppressing effect is insufficient. On the other hand, when the thickness of the first insulating layer 2 exceeds 30 µm, the volume or weight is increased, leading to a decrease in energy density (capacity) or power density. Therefore, the thickness of the first insulating layer 2 is preferably 3 nm to 30 µm, and more preferably 10 nm to 1 µm.

Further, the dielectric constant of the first insulating layer 2 is preferably 50 or less, more preferably 30 or less, and still more preferably 10 or less. The dielectric constant (relative permittivity) is a value obtained by dividing permittivity of a material by permittivity of vacuum. The dielectric constant $\varepsilon_r$ is expressed by "$\varepsilon_r$=(permittivity $\varepsilon$ of material)/(permittivity $\varepsilon_0$ of vacuum)". When the dielectric constant exceeds 50, a polarization due to a voltage is too large and a large amount of electrons and holes become adsorbed onto the surface of the insulating layer, whereby the charge is completed instantaneously and the battery capacity is reduced. Therefore, the dielectric constant of the first insulating layer is preferably 50 or less, and more preferably 30 or less. The dielectric constant is more preferably 10 or less, and still more preferably 5 or less. The lower limit of the dielectric constant is preferably 2 or more. When the dielectric constant is less than 2, the polarization is small. Therefore, the force for attracting electrons and holes at the time of charge may become too weak, and the amount of electrons and holes injected into the semiconductor layer may be insufficient.

The dielectric constant is a value specific to a material. However, the dielectric constant changes depending on a state of the material, such as film density or density of the layer. In accord with decrease in such a density, the dielectric loss increases and the dielectric constant tends to decrease. Therefore, the dielectric constant can be brought closer to a theoretical value by improving the density. Theoretically, when the density of the layer reaches a true density, the dielectric constant of the theoretical value of the material can be obtained. The true density used herein means the density of the true state of the material. Specifically, the true density of an object is equal to a value obtained by dividing the mass of the object by a volume excluding pores or voids contained in the surface or inside of the object, that is, the volume of the object itself.

In order to improve the density of the layer and approach the true density, for example, the film density can be improved when forming a film as the layer, wherein a method of promoting crystallization by heating a substrate during film formation or performing heat treatment after film formation is effective. For example, when a $Si_3N_4$ film is formed as an insulation layer by sputtering, it is preferable to heat the substrate at 200° C. to 400° C. during film formation.

In order to obtain a sufficient electron-hole recombination suppressing effect, it is preferable to control the thickness and the dielectric constant of the insulating layer. Further, this can prevent the battery from becoming a condenser. There is a possibility that the energy density may become lowered if the battery progresses towards becoming a condenser.

Therefore, the first insulating layer 2 preferably has a thickness of 3 nm to 30 μm and a dielectric constant of 50 or less, more preferably 30 or less, and still more preferably 10 or less. Further, the first insulating layer 2 preferably has a thickness of 10 nm to 1 μm and a dielectric constant of 30 or less, and more preferably 5 or less. Since the storage capacity of the semiconductor layer can be increased by setting this range, the energy density of the semiconductor solid state battery can be improved.

Further, the thickness of the first insulating layer can be measured by an enlarged photograph of a cross section. Examples of enlarged photographs includes a SEM photograph and a TEM photograph. It is preferable to enlarge to a magnification of 5,000 times or more.

Further, a resonator method can be used to measure the dielectric constant. The resonator method is a method where a resonator such as a cavity resonator is used to perform measurement based on a change in resonance of a minute object being measured. A multilayer film may be employed as the first insulating layer and other similar layers. The resonator method is a method that can measure a multilayer film as it is.

Further, when the film thickness of the multilayer film is 100 nm or more, a perturbation type cavity resonator method is effective. A temperature of a test environment is room temperature (25±2° C.). Further, in the case of the multilayer film having a thickness of less than 100 nm, capacitance-voltage measurement (C-V measurement) is effective.

Further, the first insulating layer is preferably a layer or film made of one or more selected from a metal oxide, a metal nitride, and an insulating resin. The metal oxide is preferably an oxide (including complex oxides) of one or more selected from silicon, aluminum, tantalum, nickel, copper, and iron. The metal nitride is preferably a nitride (including composite nitrides) of one or more selected from silicon and aluminum. The first insulating layer may also be a metal oxynitride. The first insulating layer may be an insulating resin.

Further, various film forming methods such as a chemical vapor deposition (CVD) method, a sputtering method, and a thermal spraying method can be applied for the metal oxide film or the metal nitride film. It is also effective to set a film formation atmosphere to an oxygen-containing atmosphere so as to form an oxide film. Similarly, the film formation atmosphere may be set to a nitrogen-containing atmosphere so as to form a nitride film. Further, heat treatment may be added if necessary.

The first insulating layer preferably has a film density of 60% or more of that of a bulk body. The film density is a filling rate of a material constituting the insulating layer and indicates a proportion of vacancies. As the film density becomes greater, the number of vacancies becomes smaller. When the film density is 60% or more, the electron-hole recombination suppressing effect by the first insulating layer can be easily obtained. The higher the film density, the more easily can the effect be obtained. Therefore, the film density is preferably 60% or more of the bulk body, and more preferably 80% to 100% of the bulk body. Further, when the film density is low, current leakage is apt to occur.

The film density used herein is synonymous with the ratio of the density relative to the true density described above. That is, the density of the first insulating layer is preferably 60% or more of the true density. For example, the insulating layer, of which the film density is 100% of the bulk body, is in a true density state. Such an insulating layer does not contain vacancies or the like.

Hereinafter, concrete values of the true density are shown. In the case of $SiO_2$, the true density is 2.65 g/cm³ for α-quartz of a trigonal system and 2.53 g/cm³ for β-quartz of a hexagonal system. In the case of $Al_2O_3$, the true density is 4.0 g/cm³ for α-$Al_2O_3$ of a rhombohedral system, 3.3 g/cm³ for β-$Al_2O_3$ of a hexagonal system, and 3.6 g/cm³ for γ-$Al_2O_3$ of a cubic system. In the case of SiON, the true density is 2.8 g/cm³ for orthorhombic crystals, 3.9 g/cm³ for tetragonal crystals, and 4.1 g/cm³ for monoclinic crystals. Further, the true density is 3.44 g/cm³ for $Si_3N_4$ of a hexagonal system, 3.2 g/cm³ for AlN of a hexagonal system, 4.1 g/cm³ for AlN of a cubic system, and 9.68 g/cm³ for $HfO_2$ of monoclinic crystals.

Furthermore, when the film density (density of the layer) is 60% or more of the true density, the dielectric constant generally has the following value. 3.0 to 5.0 for $SiO_2$, 7.0 to 10.0 for $Al_2O_3$, 5.0 to 9.0 for SiON, 6.5 to 9.0 for $Si_3N_4$, 7.5 to 10.5 for AlN, 22.0 to 26.0 for $HfO_2$, and 2.0 to 4.0 for a silicone resin.

In the method of measuring the density of the first insulating layer, an arbitrary cross section is taken on an enlarged photograph, and materials composing the layer and the vacancies are distinguished by image analysis.

Further, a method of measuring a density or a thickness of the layer by X-ray reflectivity (XRR) is also effective. When the sample is flat with a surface roughness Ra of several nm or less, XRR is preferred. When the reflectance intensity is measured, the reflectance intensity vibrates with respect to a scattering angle (2θ) due to X-ray interference. Fitting is performed by using measured data as parameters for the thickness, density, surface, and interface roughness of each layer. As a theoretical equation for fitting, a combination of a Parratt multilayer film model and a Nevot-Croce roughness equation is used. By examining values such as the thickness and the like in advance by TEM and SEM, the examined values can be used to more accurately measure the density and the like.

Preferably, at least one of the N-type semiconductor and the P-type semiconductor is made of one selected from the group consisting of metal silicide, metal oxide, amorphous silicon, polycrystalline silicon, crystalline silicon, and monocrystalline silicon.

More preferably, both the N-type semiconductor and the P-type semiconductor are made solely of one selected from these materials. The materials of the N-type semiconductor and the P-type semiconductor may be identical to or different from each other. Among the above-described materials, it is more preferable that the material of the N-type semiconductor and the material of the P-type semiconductor are one of metal silicide and metal oxide.

The N-type semiconductor 3 uses electrons as carriers. Further, the P-type semiconductor 4 uses holes as carriers. Recombination of electrons and holes after accumulating electricity can be suppressed by taking a stacked structure of the N-type semiconductor 3, the first insulating layer 2, and the P-type semiconductor 4. Since self-discharge can be suppressed by suppressing the recombination of electrons and holes, it is possible to increase the capacity of the semiconductor solid state battery.

In order to increase the capacity, it is necessary to optimize the amount of electrons and holes in the semiconductor layer. In metal silicide, metal oxide, amorphous silicon, polycrystalline silicon, crystalline silicon, and monocrystalline silicon, the amount of electrons or holes that serve as carriers can be easily controlled. Further, the amount of carriers in the N-type semiconductor 3 and the P-type semiconductor 4 can be controlled by impurity doping or deficiency introduction.

The metal silicide is preferably one selected from barium silicide ($BaSi_2$), iron silicide ($FeSi_2$), magnesium silicide ($MgSi_2$), manganese silicide ($MnSi_{1.7}$), germanium silicide (SiGe), and nickel silicide ($NiSi_2$). The metal oxide is preferably one selected from tungsten oxide ($WO_3$), molybdenum oxide ($MoO_2$, $MoO_3$), titanium oxide ($TiO_2$), tin oxide ($SnO_2$) zinc oxide (ZnO), nickel oxide (NiO), copper oxide ($Cu_2O$), cadmium oxide (CdO), and aluminum oxide ($Al_2O_3$).

Preferably, many electron or hole capture levels are introduced into the N-type semiconductor or the P-type semiconductor. The capture level is an energy level that captures electrons or holes, and is also referred to as a trap level. The capture level is preferably in the range of $10^{17}$ $cm^{-3}$ to $10^{22}$ $cm^{-3}$, and more preferably in the range of $10^{18}$ $cm^{-3}$ to $10^{22}$ $cm^{-3}$. As the capture level, there exist an impurity level and a defect level. The impurity level is an energy level obtained by substituting an element by doping of impurities. The impurity level can be controlled by adjusting the doping amount of impurities. The defect level is an energy level generated by deficiency of an element. In the case of the metal oxide, the impurity level is an energy level obtained by providing an oxygen deficiency or a metal deficiency.

In the case of the metal silicide, the defect level can be obtained by providing impurity doping or composition deviation. Further, amorphous silicon, polycrystalline silicon, crystalline silicon, and monocrystalline silicon can trap carriers at grain boundaries. Thereby, trap levels (capture levels) can be introduced.

As described above, capture levels for electrons and holes can be introduced by impurity doping, deficiency (defect), and grain boundaries. One of these may be introduced, or two or more may be combined.

Since carriers in the N-type semiconductor are electrons, the capture level introduced into the N-type semiconductor is a capture level for electrons. Similarly, since carriers in the P-type semiconductor are holes, the capture level introduced into the P-type semiconductor is a capture level for holes. The capture level may be introduced into one of the N-type semiconductor and the P-type semiconductor. Alternatively, the capture levels may be introduced to both the N-type semiconductor and the P-type semiconductor.

As conduction mechanisms for a semiconductor, there exist hopping conduction and band conduction. Hopping conduction indicates a state where almost all electrons are in a localized state in a semiconductor, and electric conduction takes place by electrons successively jumping (hopping) from one localized state to another. In hopping conduction, the mean free path of the electrons depends on the distance between atoms (in impurity conduction, the distance between impurity atoms), and the electric conductivity is far lower than in the case of free electrons, thus exhibiting such a behavior in contrast to that for free electrons having a long mean free path. The jumping (hopping) process is assisted by thermal vibration of atoms. Further, the state where "almost all electrons are localized" means the state where the electrons existing in the conduction band exist near the energy minimum point of the conduction band.

Meanwhile, band conduction indicates a state where electrons (or holes) undergo electric conduction in a relatively wide range (broad band region) in the semiconductor. The electrons (or holes) are generated due to the deviation of the semiconductor from the stoichiometric composition.

In the semiconductor made of metal silicide or metal oxide, the level amount (position) and the conduction mechanism can be controlled by impurity doping or defect introduction.

For example, in the metal silicide, an impurity level can be introduced by impurity doping. By introducing the impurity level, hopping conduction becomes dominant and carriers are easily accumulated at the trap level.

Further, in the metal oxide, a defect level can be introduced by providing an oxygen deficiency. By introducing the defect level, hopping conduction through defects becomes dominant and carriers can be easily accumulated in the trap level.

As described above, in the semiconductor made of the metal silicide or the metal oxide, hopping conduction becomes dominant by introducing the impurity level or the defect level. In other words, it can be said that a semiconductor exhibiting hopping conduction property is in a state in which carriers are easily accumulated at the trap level.

In the case of the semiconductor made of the metal silicide or the metal oxide, the temperature dependency of the resistivity decreases when the hopping conduction property becomes dominant. In a graph where the vertical axis represents the resistivity, and the horizontal axis represents 1000/T, with T being the temperature (K: Kelvin), the slope of the graph becomes gentle if the hopping conduction property becomes dominant. On the other hand, when band conduction becomes dominant, the slope of the graph becomes steep. In other words, it is possible to determine which of the hopping conduction and the band conduction dominates based on the resistivity and the slope angle of the graph when the 1000/T graph is created. In particular, the slope of the graph in the range where 1000/T is 2.8 to 4.0 is compared.

Further, when the metal silicide exhibits hopping conduction property, a substantially linear or substantially parabolic behavior is exhibited in a graph taking resistivity on the vertical axis and 1/T on the horizontal axis. Here, T is the Kelvin temperature.

As described above, metal oxides such as $WO_3$ exhibit hopping conduction due to oxygen deficiency. Metal silicides such as $BaSi_2$ exhibit hopping conduction due to impurity doping. By achieving hopping conduction property, there can be achieved a state where carriers can be easily accumulated at the capture level (trap level).

As the hopping conduction, there are mainly NNH (Nearest Neighbor Hopping), Mott-type VRH (Mott-type Variable-Range Hopping), and Shklovskii-type VRH (Shklovskii-type Variable-Range Hopping). For example, $WO_3$ exhibits NNH conduction property due to oxygen deficiency. On the other hand, $BaSi_2$ exhibits VRH conduction when certain impurities (for example, Ga, Al, Ag, Cu, or the like) are doped. When the VRH conduction is exhibited, a relational expression of $\ln \rho \propto T^{1/2}$ that is characteristic thereof or $\ln \rho \propto T^{1/4}$ that is characteristic of the Shklovskii type VRH conduction (here, $\rho$ ($\Omega \cdot cm$) indicates the resistivity, and T indicates the temperature at the time of resistance measurement) is satisfied.

Here, when the hopping conduction property becomes dominant in the semiconductor made of the metal silicide or the metal oxide, the resistivity is significantly reduced as compared with the metal silicide without impurity doping (undoped) or the metal oxide without oxygen deficiency. The resistivity can be significantly reduced by having the hopping conduction property be dominant.

Further, the resistivity of a tungsten oxide powder ($WO_3$) at room temperature is $10^3$ $\Omega \cdot cm$ or more. The resistivity can be significantly reduced by having the hopping conduction property be dominant. Internal resistance can be reduced by lowering the resistivity of the semiconductor. Output density can be increased by lowering the internal resistance. This improves the rapid charge and discharge performance of the battery.

Figure 4:
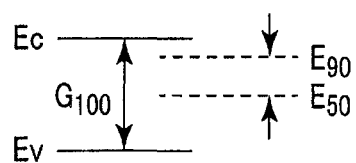
FIG. 4 is a conceptual diagram showing energy level positions of an N-type semiconductor layer.

Taking the band gap as 100 in the N-type semiconductor layer, an energy level is preferably formed in the range of 50 to 90. As one example, FIG. 4 shows a conceptual diagram of energy level positions of an N-type oxide semiconductor layer. In FIG. 4, Ec is the bottom of the conduction band (the boundary between the conduction band and the forbidden band), and Ev is the top of the valence band (the boundary between the forbidden band and the valence band). The width (Ec-Ev) between Ec and Ev is the band gap. The energy level positions in the band gap are counted taking Ec as 100 and Ev as 0. In FIG. 4, when the width of the band gap is represented by $G_{100}$ and the band gap $G_{100}$ is taken to be 100, the level position corresponding to 50 is represented by $E_{50}$ and the level position corresponding to 90 is represented by $E_{90}$.

When the width of the band gap is taken as being 100, energy level positions are preferably in the range of 50 to 90. That is, energy level(s) preferably exist between the illustrated level position $E_{50}$ and the illustrated level position $E_{90}$. When the energy level is in the range higher than the level position $E_{90}$, an energy level would exist near the conduction band of the N-type oxide semiconductor layer (or the metal silicide semiconductor layer). When the energy level(s) exist near the conduction band, electrons gather immediately in the vicinity of the first insulating layer, which causes interface carrier concentration. When the energy level is in the range of 50 to 90, the energy level is being provided at a somewhat deeper position. This way, interface carrier concentration can be prevented from occurring immediately. Therefore, the capacity reduction can be suppressed. Further, when the energy level position is lower than the level position $E_{50}$, the level may be too deep and extraction of electrons may be difficult. When it is difficult to take out electrons, the battery capacity is reduced.

Figure 5:
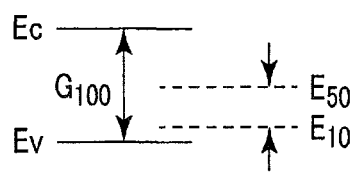
FIG. 5 is a conceptual diagram showing energy level positions of a P-type semiconductor layer.

Further, as one example, FIG. 5 shows a conceptual diagram of energy level positions of a P-type oxide semiconductor layer. In FIG. 5, Ec is the bottom of the conduction band (the boundary between the conduction band and the forbidden band), and Ev is the top of the valence band (the boundary between the forbidden band and the valence band). The width (Ec-Ev) between Ec and Ev is the band gap. When the band gap is taken to be 100 in the P-type semiconductor layer, energy levels are preferably formed in the range of 10 to 50. The positions of the energy levels in the band gap are counted taking Ec as 100 and Ev as 0. In FIG. 5, when the width of the band gap is represented by $G_{100}$ and the band gap $G_{100}$ is taken as being 100, the level position corresponding to 10 is represented by $E_{10}$ and the level position corresponding to 50 is represented by $E_{50}$.

Taking the width of the band gap as 100, energy level positions are preferably 10 to 50. That is, energy level(s) preferably exist between the illustrated level position $E_{10}$ and the illustrated level position $E_{50}$. When an energy level exists near the valence band below the level position $E_{10}$, holes gather immediately in the vicinity of the first insulating layer, which causes interface carrier concentration. When the energy level is 10 to 50, the level would be provided at a somewhat deeper position. This way, interface carrier concentration can be prevented from occurring immediately. Therefore, the capacity reduction can be suppressed. Further, when the level position is higher than the level position $E_{50}$, the energy level may be too deep and extraction of holes may be difficult. When it is difficult to take out holes, the battery capacity is reduced.

More preferably, the N-type semiconductor layer is an oxide semiconductor or a metal silicide semiconductor, and energy level(s) is (are) formed in the range of 50 to 90, taking the width of the band gap in the semiconductor as 100. Similarly, more preferably, the P-type semiconductor layer is an oxide semiconductor or a metal silicide semiconductor, and energy level(s) is (are) formed in the range of 10 to 50 taking the width of the band gap in the semiconductor as 100.

Further, as the method of controlling the level position(s) in the oxide semiconductor, it is preferable to provide the deficiency of oxygen or metal. The deficiency of oxygen or metal can be provided by, for example, controlling the conditions when forming the layer. Further, deficiency can also be introduced by heat treatment after forming the layer. Aside from that, the deficiency can be formed by irradiation of electron beam or ultraviolet rays. Details of methods of introducing the deficiency will be described later.

Further, as the method of controlling the level position(s) in the metal silicide semiconductor, there is a method of controlling an element ratio or a dopant element. The control of the elemental ratio is performed through an atomic ratio between a metal and silicon constituting the metal silicide. When the metal silicide is represented by $MSi_n$, where M represents a metal and n represents the valence number, M=Ba and n=2 for $BaSi_2$. Among barium silicides, $BaSi_2$ is stable.

A barium silicide layer is preferably formed to have a compositional deviation entirely or partially. In $BaSi_2$, n=2 is stable. It is effective to form a portion which does not become n=2, staying within the range of n=1.5 to 2.5. Further, the compositional deviation of the metal silicide layer can be formed by changing the layer forming rate (nm/sec) in the layer forming process.

In order to measure the level position(s) in the oxide semiconductor or the metal silicide, it is effective to combine the measurement method of obtaining the depth of the level and the measurement method of obtaining the band gap, from a single layer or film. Here, the level depth means the energy difference between the bottom of the conduction band and the level position in the case of the N-type semiconductor. Further, in the case of the P-type semiconductor, the level depth means the energy difference from the top of the valence band to the level position.

Examples of the measurement method of obtaining the level depth include a method of obtaining activation energy from temperature dependency of resistivity and a method using deep level transient spectroscopy (DLTS).

In the method of obtaining activation energy from temperature dependency of resistivity, resistance values are measured at various measurement temperatures T (Kelvin). An ohmic electrode is formed on a single layer or film, and a resistivity thereof is measured. The activation energy is obtained from the slope of a graph where the horizontal axis represents 1/T, and the vertical axis represents resistance. Here, for example, in the case of the N-type semiconductor, the activation energy $E_a$ corresponding to the level depth can be obtained by performing fitting using the following equation. The level depth can be obtained in the same manner as described above for the P-type semiconductor, as well.

$$\rho(T) = \left\{ \left[ \frac{1}{qN_d\mu_b} \exp\left(\frac{qE_a}{kT}\right) \right]^{-1} + \left[ \frac{1}{qN_o\mu_h} \exp\left(\frac{q\varepsilon}{kT}\right) \right]^{-1} \right\}^{-1}$$

$\rho(T)$: Resistivity of thin film $N_d$: Carrier density of conduction band, $N_o$: Carrier density of nearest neighbor hopping conduction band $\mu_b$: Carrier mobility of conduction band, $\mu_h$: Carrier mobility of nearest neighbor hopping conduction band $E_a$: Energy difference between energy level and bottom of conduction band, q: Elementary charge $\varepsilon$: Average activation energy of electrons between neighbor carrier traps at energy level.

Further, in the case of deep levels, deep level transient spectroscopy (DLTS) can be used. In this method, it is necessary to form a Schottky barrier junction metal electrode on a single layer or film so as to form a Schottky diode. The level depth can be measured by applying a reverse voltage to a diode to widen a depletion layer and obtaining a response of electrostatic capacitance as a signal when the applied voltage is changed.

In order to specify the level position in the band gap, it is necessary to measure the band gap itself aside from determining the level depth by the above method. Examples of the method of measuring the band gap include the measurement of light absorbance using a spectrophotometer. The transmission spectrum of the single layer or film is measured, the wavelength of the horizontal axis is converted into eV, and the transmittance of the vertical axis is converted into $\sqrt{\alpha}hv$ ($\alpha$: absorption coefficient, h: Planck constant, v: light velocity). In the spectrum after conversion, a straight line is fitted to the portion where the absorption rises. The eV value at which this straight line intersects with a baseline corresponds to the band gap. Further, as another method, there is also a method using photoacoustic measurement spectroscopy (PAS).

The level position can be specified by combining the band gap and the level depth obtained as described above.

The above described barium silicide, iron silicide, nickel silicide, tungsten oxide, and molybdenum oxide are semiconductors in which carriers can be easily accumulated in trap levels by the introduction of defect levels. Further, the metal silicide is suitable for the P-type semiconductor. The metal oxide is suitable for the N-type semiconductor.

Amorphous silicon, polycrystalline silicon, crystalline silicon, and monocrystalline silicon can trap carriers at grain boundaries. Thereby, trap levels (capture levels) can be introduced.

As described above, capture levels for electrons and holes can be introduced by impurity doping, deficiency, and grain boundaries. Further, one of these may be used, or a combination of two or more may be used.

The impurity doping amount into metal silicide is preferably in the range of $10^{17}$ $cm^{-3}$ to $10^{22}$ $cm^{-3}$, and more preferably in the range of $10^{18}$ $cm^{-3}$ to $10^{22}$ $cm^{-3}$. Further, the impurity doping amount into amorphous silicon, polycrystalline silicon, crystalline silicon, and monocrystalline silicon is preferably in the range of $10^{17}$ $cm^{-3}$ to $10^{22}$ $cm^{-3}$, and more preferably in the range of $10^{18}$ $cm^{-3}$ to $10^{22}$ $cm^{-3}$. Examples of the impurity to be doped include various impurities such as Ag, Al, Cu, Ga, In, or Sb. One or more impurities selected from Ag, Al, Cu, and Ga are elements suitable for introducing capture level(s) into metal silicide. In or Sb may be introduced only to the surface level.

In order to perform the impurity doping amount, measurement can be performed and analyzed by secondary ion mass spectrometry (SIMS). Further, a method of preparing plural standard samples with varying impurity doping amounts and creating a calibration curve is also effective. It is also effective to perform SIMS after specifying the impurity element(s) in advance by X-ray photoelectron spectroscopy (XPS) or the like.

The oxygen deficiency is preferably in the range of $10^{17}$ $cm^{-3}$ to $10^{22}$ $cm^{-3}$, and more preferably in the range of $10^{18}$ $cm^{-3}$ to $10^{22}$ $cm^{-3}$.

Here, the oxygen deficiencies indicates the state where, in a crystal lattice of a material composing the semiconductor, a part of oxygen atoms composing the crystal lattice is not present. The carrier density means the amount of electrons or holes serving as carriers that are present. The carriers are holes in a P-type semiconductor, and the carriers are electrons in an N-type semiconductor. The carrier density can be determined as a product of the state density and the Fermi-Dirac distribution function.

While the oxygen deficiencies indicate the amount of missing oxygen atoms in the crystal lattice, the carrier density indicates the amount of electrons (or holes) present. The oxygen deficiencies and the carrier density are parameters different from each other. When hopping conduction is exhibited, polarons are formed by conducting electrons and lattice distortion associated with the oxygen deficiencies. A conduction mechanism is generated by the polarons. Therefore, by exhibiting hopping conduction properties, the amount of oxygen deficiencies and the carrier density can be made to be almost of same values.

Therefore, in the case of the semiconductor in which hopping conduction is dominant, the deficiency amount can be obtained by measuring the carrier density. The carrier density can be measured by SMM or SCM. SMM refers to scanning microwave microscopy. SCM refers to scanning capacitance microscopy.

For measurement of the impurity doping amount, a method of comparing the intensity of a modulation signal (dC/dV) or a microwave reflectance by using a standard sample doped with a predetermined impurity amount serves well. At this time, it is effective to prepare plural standard samples with varying doping amounts in advance and prepare a calibration curve. It is also effective to identify an impurity doping material in advance by XPS or the like. Further, in the case of measurement by SMM or SCM, measurement is performed after mirror surface polishing (surface roughness Ra of 0.1 μm or less) the sample surface.

Further, in the case of deep levels, it is possible to directly measure the level amount by using deep level transient spectroscopy (DLTS). A reverse voltage is applied to a Schottky diode to widen a depletion layer, and a response of capacitance when the applied voltage is changed is obtained as a signal. For example, $TiO_2$ or NiO has high insulating properties at a stoichiometric ratio (an O/Ti ratio is 2 for $TiO_2$, and an O/Ni ratio is 1 for NiO). On the other hand, when the resistivity is decreased, it can be determined that oxygen deficiency is introduced into $TiO_2$ and Ni deficiency is introduced into NiO. In this manner, the energy level amount can be measured.

The amount of grain boundaries can be controlled by adjusting the crystal size. The average crystal grain size is preferably in the range of 50 nm to 1,000 nm. When the average crystal grain size is less than 50 nm, there would be too much grain boundaries, whereby electrons and holes become inhibited when moving, and thereby, the electrical resistance would be excessively large. When the electrical resistance is high, the voltage drop at the time of discharge increases, and the battery capacity and the operating voltage decreases. Further, it is considered that the mobility of electrons and holes would be lowered because the electrons and holes become overly trapped at the time of movement. A decrease in mobility leads to a decrease in output density. Further, when the average crystal grain size exceeds 1,000 nm (1 μm), the grain boundary trapping effect is small, and thus the improvement effect of the battery capacity (energy density) is small. In order to achieve both the energy density and the output density and further increase the operating voltage, it is preferable to set the average crystal grain size in the range of 50 nm to 1,000 nm.

The abundance ratio of grain boundaries is determined by the crystal size of the semiconductor. The crystal size of the semiconductor can be examined using an enlarged photograph obtained by SEM or TEM. The introduction of the trap levels by grain boundaries is effective for crystalline semiconductors. Therefore, such a method of introduction can be applied to a crystalline semiconductor among metal silicides, metal oxides, amorphous silicon, crystalline silicon, polycrystalline silicon, and monocrystalline silicon.

The thicknesses of the N-type semiconductor 3 and the P-type semiconductor 4 are not particularly limited, but are preferably 0.1 μm to 200 μm.

When the thickness of the semiconductor is as thin as less than 0.1 μm (100 nm), the amount of carriers generated is small, raising concern that it may be difficult to increase the energy density, that is, the electrical capacity per weight or area. Further, when the thickness exceeds 200 μm, the movement distance of the carriers is long and the internal resistance is increased. In which case, the voltage drop at the time of discharge may be large. Further, there is concern that the rapid charge and discharge performance may be deteriorated. Note that the electrical capacity is indicated by the energy density (Wh/kg). Further, the rapid charge and discharge performance may be indicated by the output density (W/kg).

Further, the N-type semiconductor 3 is provided with a first electrode 5. The first electrode 5 is referred to as an N-type side electrode. Further, the P-type semiconductor 4 is provided with a second electrode 6. The second electrode 6 is referred to as a P-type side electrode. In FIG. 1, electrodes are respectively provided on the end surfaces of the N-type semiconductor 3 and the P-type semiconductor 4. The position for forming the electrodes is not limited to the end surface, but may be at a portion on a side surface. Further, a single or plural first electrode 5 may be provided. Similarly, a single or plural second electrode 6 may be provided.

The first electrode 5 and the second electrode 6 are preferably made of a highly electrically conductive metal material such as copper or aluminum. Further, the first electrode 5 and the second electrode 6 may be a transparent electrode such as indium-doped tin oxide (ITO).

Figure 2:
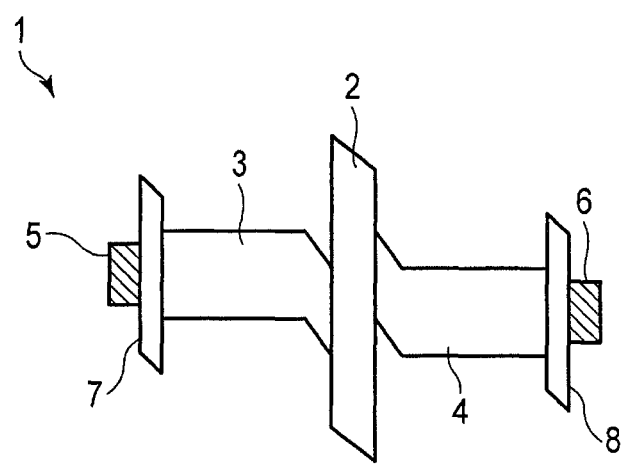
FIG. 2 is a schematic view of another semiconductor solid state battery according to the embodiment.

A preferable structure is one in which a second insulating layer disposed between the N-type semiconductor and the first electrode, a third insulating layer disposed between the P-type semiconductor and the second electrode, or both the second insulating layer and the third insulating layer are provided. FIG. 2 shows a structure in which the second insulating layer and the third insulating layer are provided. In FIG. 2, reference numeral 1 denotes a semiconductor solid state battery, reference numeral 2 denotes a first insulating layer, reference numeral 3 denotes an N-type semiconductor, reference numeral 4 denotes a P-type semiconductor, reference numeral 5 denotes a first electrode (N-type side electrode), reference numeral 6 denotes a second electrode (P-type side electrode), reference numeral 7 denotes a second insulating layer, and reference numeral 8 denotes a third insulating layer.

Although FIG. 2 shows the structure in which both the second insulating layer 7 and the third insulating layer 8 are provided, a structure provided with only one of the two may also be adopted. That is, as in the shown structure, the second insulating layer 7 may be provided between the N-type semiconductor 3 and the first electrode 5, while the third insulating layer 8 may be provided between the P-type semiconductor 4 and the second electrode 6. On the other hand, the second insulating layer 7 may be provided between the N-type semiconductor 3 and the first electrode 5, and the third insulating layer 8 may be omitted. Alternatively, the third insulating layer 8 may be provided between the P-type semiconductor 4 and the second electrode 6, and the second insulating layer 7 may be omitted.

When the second insulating layer 7 and the third insulating layer 8 are provided, a tunnel effect can be obtained on either side. Since the tunnel effect is obtained, high capacity can be obtained. If there is no second insulating layer 7, carriers stored in the N-type semiconductor 3 easily flow to the first electrode 5 and electricity is not easily accumulated. Similarly, if there is no third insulating layer 8, carriers stored in the P-type semiconductor 4 easily flow to the second electrode 6 and electricity is not easily accumulated.

At least one of the second insulating layer 7 and the third insulating layer 8 preferably has a thickness of 30 nm or less and a dielectric constant of 50 or less. More preferably, the dielectric constant is 30 or less, and more preferably 10 or less. When the thickness exceeds 30 nm, the insulating layers become a resistor, making extraction of electricity difficult. Similarly, when the dielectric constant exceeds 50, a large number of carriers become concentrated on these insulating layers, whereby there is concern that there cannot be accumulated a large number of carriers in the semiconductor.

Therefore, the thicknesses of the second insulating layer 7 and/or the third insulating layer 8 is preferably 30 nm or less, and more preferably 10 nm or less. Further, the lower limit of the thickness is not particularly limited, but is preferably 3 nm or more. When the thickness is as thin as less than 3 nm, the tunnel effect is insufficient and carriers easily become extinguished. Further, the dielectric constant is preferably 50 or less, and more preferably 30 or less. More preferably, the dielectric constant is 10 or less, and more preferably 5 or less. Further, the lower limit of the dielectric constant is not particularly limited, but is preferably 2 or more. When the dielectric constant is less than 2, the tunnel effect may be insufficient.

Further, for at least one of the second insulating layer 7 and the third insulating layer 8, the material is preferably one or more selected from a metal oxide, a metal nitride, and an insulating resin. The metal oxide is preferably oxide(s) (including complex oxides) of one or more selected from silicon, aluminum, tantalum, nickel, copper, and iron. Further, the metal nitride is preferably nitride(s) (including composite nitrides) of one or more selected from silicon and aluminum. Further, the material may also be a metal oxynitride. Further, the material may be an insulating resin.

Figure 3:
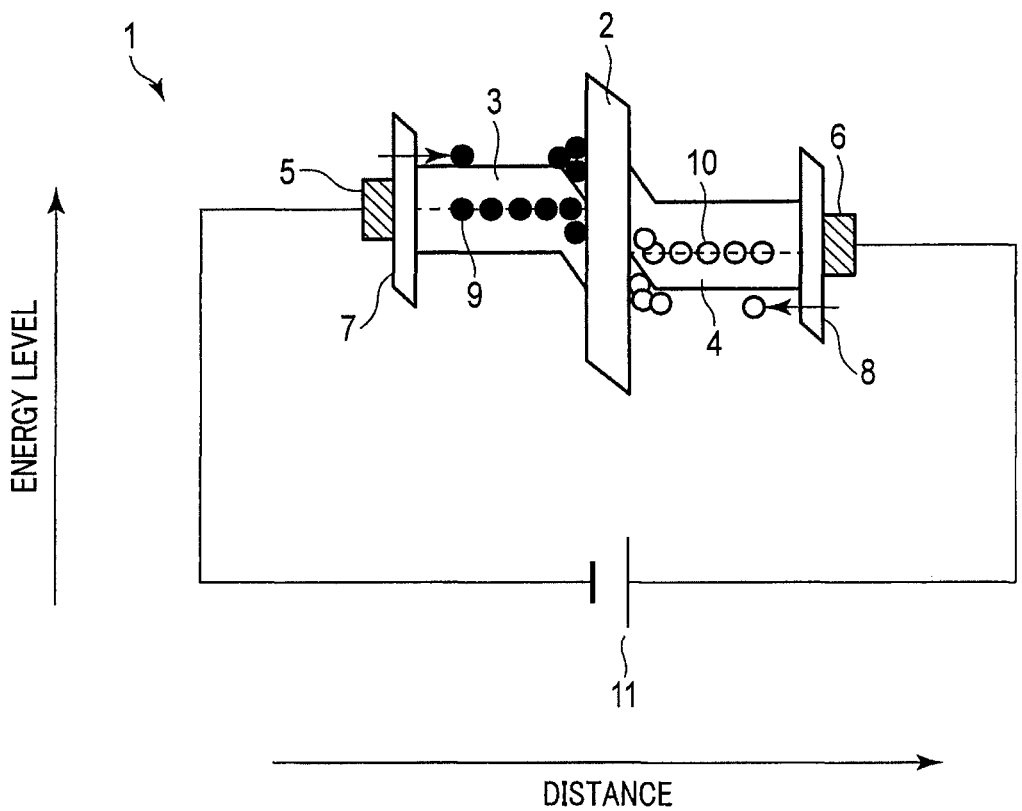
FIG. 3 is a schematic view showing movement of electrons and holes of the semiconductor solid state battery according to one example of the embodiment.

Next, the operation will be described. FIG. 3 schematically shows the movement of carriers (electrons or holes). In FIG. 3, reference numeral 1 denotes a semiconductor solid state battery, reference numeral 2 denotes a first insulating layer, reference numeral 3 denotes an N-type semiconductor, reference numeral 4 denotes a P-type semiconductor, reference numeral 5 denotes a first electrode (N-type side electrode), reference numeral 6 denotes a second electrode (P-type side electrode), reference numeral 7 denotes a second insulating layer, reference numeral 8 denotes a third insulating layer, reference numeral 9 denotes electrons, reference numeral 10 denotes holes, and reference numeral 11 denotes a power supply. Further, FIG. 3 is a conceptual diagram of bands of the semiconductor solid state battery, in which the longitudinal direction indicates the energy level and the lateral direction indicates distance.

When electricity flows from the power supply 11, electrons 9 are generated in the N-type semiconductor 3 and holes 10 are generated in the P-type semiconductor 4. The electrons 9 and the holes 10 serving as carriers are accumulated. The storage state is obtained by storing the carriers. Since the first insulating layer 2 is provided, recombination of electrons and holes after storage of electricity is suppressed. Since self-discharge can be suppressed by suppressing the recombination, the capacity can be increased.

In FIG. 3, the upper side of the solid line of the semiconductor layer (the N-type semiconductor 3 and the P-type semiconductor 4) shows the lower end of the conduction band, and the lower side of the solid line shows the upper end of the valence band. Further, a section where the electrons 9 or the holes 10 are linearly arranged (indicated by the dashed line) indicates a Fermi level.

At the time of charge, electrons moving within the conduction band become trapped at the capture level, and holes moving within the valence band become trapped at the capture level. Further, the carriers (electrons, holes) can be conducted through capture levels (impurity level, defect level) by introducing hopping conduction into the semiconductor as described above. Therefore, it is not necessary to re-excite the electrons or the holes into the conduction band or the valence band, and the internal resistance can be reduced. This improves the output density. Therefore, the rapid charge and discharge performance can be obtained.

Further, in a film coated with insulating coated semiconductor fine particles found in other semiconductor batteries, the movement of carriers at the time of discharge is inhibited by the insulating film, and the internal resistance becomes excessively high. In contrast, for the semiconductor solid state battery according to the embodiment, a large number of carriers can be accumulated by using semiconductor monolayers and introducing a deep capture level into each semiconductor monolayer. Therefore, the inhibition of carrier movement at the time of discharge is reduced, and the internal resistance can be reduced. By reducing the internal resistance, the voltage drop can be suppressed to 0.5 V, or even further to 0.3 V or less. This leads to an increase in the operating voltage of the battery.

FIG. 6 shows an outline of an example in which the capture level is at a shallow position. Shown here is an example, where the band gap of the semiconductor is taken as 100, and energy levels are present at a position within the range of 91 to 100 in the N-type semiconductor 3 and within 0 to 9 in the P-type semiconductor 4. As shown in FIG. 6, the carriers (electrons or holes) are concentrated at the central insulator (first insulating layer 2), due to shallow level(s) having been formed.

FIG. 7 shows an outline of a more preferable example in which the capture level is at a deep position. Shown here is an example, where the band gap of the semiconductor is taken as 100, and energy levels are present at a position within the range of 50 to 90 in the N-type semiconductor 3 and within 10 to 50 in the P-type semiconductor 4 As shown in FIG. 7, the carrier concentration at the central insulator is suppressed by the formation of the deep level. Thereby, large numbers of carriers can be accumulated in the N-type and P-type semiconductor layer monolayers, and the capacity can be increased. By increasing the capacity as described above, for example, the energy density can become 2 $\mu Wh/cm^2$ or more, and further, 3 $\mu Wh/cm^2$ or more.

With the semiconductor solid state battery as described above, a semiconductor solid state secondary battery having high energy density and high operating voltage can be provided. Further, since it is not necessary to use the electrolyte solution as in the conventional Li ion secondary battery, the problem of liquid leakage does not occur.

Next, a manufacturing method will be described. A method of manufacturing a semiconductor solid state battery according to an embodiment is not limited, as long as the semiconductor solid state battery has the above-described configuration; however, the following method is demonstrated as a method for efficiently obtaining the semiconductor solid state battery.

A first electrode (or second electrode) is formed onto a substrate. Next, a second insulating layer (or third insulating layer) is formed as necessary.

Next, an N-type semiconductor (or P-type semiconductor) is formed. Next, a first insulating layer, a P-type semiconductor (or an N-type semiconductor), a third insulating layer (or a second insulating layer), and a second electrode (or a first electrode) are formed. Either one of the N-type semiconductor or the P-type semiconductor may be formed before the other.

Further, as a method for forming a layer or film, various forming methods such as chemical vapor deposition (CVD), sputtering, application of fine particles dispersed in a solvent, and the like can be applied. Further, in the forming step, the substrate may be heated as necessary. Further, an Ar atmosphere, a vacuum atmosphere, and the like are appropriately adjusted.

Further, in the case of forming an oxide layer or nitride layer (or an oxide film or nitride film), atomic layer deposition (ALD), thermal oxidation (heat treatment in an oxidizing atmosphere), thermal nitridation (heat treatment in a nitriding atmosphere), and the like may be used.

In the case of using amorphous silicon, a forming method such as sputtering, vacuum evaporation, or chemical vapor deposition (CVD) can be used. With regard to polycrystalline silicon and crystalline silicon, in addition to the above-described methods, it is necessary to crystallize amorphous silicon by methods such as substrate heating during layer or film formation and heat treatment after layer or film formation. For example, after forming an amorphous silicon thin film, polycrystalline silicon and crystalline silicon can be obtained by performing heat treatment in an inert atmosphere such as nitrogen at a temperature of 600° C. or more for a certain period of time. The crystal grain size can be controlled by the heat treatment temperature or the heat treatment time.

When impurity doping is performed in the step of forming the semiconductor layer, a method of co-vapor depositing an impurity element is effective. By adjusting the proportion for co-vapor deposition, it is possible to control the impurity doping amount, that is, the amount of the impurity level.

Further, impurities may be doped by introducing gas during layer or film formation or by simultaneous layer or film formation using varying vapor deposition sources. For example, in the case of CVD, it is preferable to mix-in monosilane and phosphine ($PH_3$), which is a hydrogen compound of phosphorus, as gas in the formation of the N-type layer. For the formation of the P-type layer, it is preferable to mix-in diborane ($B_2H_6$) which is a hydrogen compound of boron, or the like as gas.

When obtaining a semiconductor layer made of metal silicide, the level position can be controlled by controlling the element ratio or the dopant element as described above. Further, the composition deviation of the metal silicide can be formed by changing the layer formation rate or film forming rate in the forming process.

Examples of the method of providing oxygen or metal deficiency include oxygen partial pressure control during layer or film formation such as vacuum film formation, heat treatment of the layer or film after formation (annealing in air atmosphere, annealing with oxidizing atmosphere gas, or the like), and electron beam/ultraviolet irradiation.

Here, in the control of oxygen during layer or film formation, it is preferable to control the partial pressure of oxygen by changing the gas introduced into the layer/film formation apparatus to a mixed gas of inert gas and oxygen. For example, in oxygen partial pressure control during layer or film formation, preferably, the substrate heating temperature is 150° C. to 280° C., and the gas flow ratio $O_2/Ar$ of $O_2$ to Ar is 0.05 or more at the RF sputtering with the output of 0.3 kW or more. The output is preferably in the range of 0.5 kW to 1.0 kW. Further, the substrate heating temperature is preferably in the range of 180° C. to 240° C. Further, the gas flow ratio $O_2/Ar$ is preferably in the range of 0.09 to 0.20.

Further, the flow rate of 02 gas is preferably 8 sccm or more. Further, the flow rate of Ar gas is preferably 100 sccm or more. For example, in the case of a NiO layer, Ni metal becomes deficient due to an excess of oxygen gas during sputtering, and a $Ni_{1-x}O$ metal deficient film is obtained as the NiO layer. Further, when the output of the RF sputtering or the substrate heating temperature is in the above-described range, the reaction between metal and oxygen can be promoted.

As a specific example, in the case of $TiO_2$ film formation (DC sputtering, substrate heating of 200° C., output of 1.0 kW) or NiO film formation (RF sputtering, substrate heating of 200° C., output of 0.6 kW) by sputtering, when the gas flow ratio $O_2/Ar$ of $O_2$ to Ar is changed within the range of 0/120 to 20/120, the resistivity changes in the range of $10^1 \cdot \Omega cm$ to $10^7$ $\Omega cm$. $TiO_2$ or NiO has high insulating properties at the stoichiometric ratio (O/Ti ratio is 2 for $TiO_2$, and O/Ni ratio is 1 for NiO), but a case where resistivity decreases is indicative of there being oxygen deficiency introduced into $TiO_2$ and Ni deficiency introduced into NiO. In this manner, it is possible to introduce deficiencies into the layer or film by controlling the amount of oxygen (oxygen partial pressure).

For introducing deficiency by heat treatment after layer or film formation, for example, the following methods are available. For example, when a thin film obtained after film formation is subjected to heat treatment in reducing gas atmosphere, oxidizing gas atmosphere, or vacuum atmosphere, lack of oxygen introduces oxygen deficiency, or excess of oxygen introduces metal deficiency. For example, when heat treatment is performed on a $TiO_2$ thin film with a band gap of about 3.2 eV under ultra-high vacuum, a deficiency level due to oxygen deficiency can be formed at a position of 0.8 eV to 1.0 eV below the lower end of the conduction band. Another example is a method of providing a metal deficiency by heat treatment at a temperature of 600° C. or more in a mixed gas of oxygen and nitrogen.

Further, in a case of providing oxygen deficiency, a method of performing heat treatment in a reducing atmosphere after forming the semiconductor layer is effective. Further, in a case of the metal oxide semiconductor layer, heat treatment is preferably performed in a mixed gas of hydrogen and nitrogen at a temperature of 600° C. or more. Further, in a case of the metal oxide semiconductor layer, necking firing is performed after formation of the layer or film, as necessary. Further, the necking firing may be performed in a reducing atmosphere, whereby the processes of providing necking and oxygen deficiency would be a single process.

The deficiency formation by electron beam and ultraviolet irradiation such as electron beam irradiation is characterized in that many deficiencies can be formed in vicinity of the surface of the layer or film, at about several nm to several hundreds of nm from the layer/film surface. For example, when a film of $TiO_2$ is irradiated with the electron beam, inner nucleus holes in vicinity of the film surface are excited and O element(s) is (are) positively charged. As a result, the charged O element(s) repulses with the Ti element, the O element(s) escapes, and oxygen deficiency is generated. With such electron beam irradiation of $TiO_2$, the deficiency level can be formed at a position 1.2 eV to 1.4 eV below the lower end of the conduction band with respect to the $TiO_2$ thin film having a band gap of about 3.2 eV.

Further, in a case of providing the oxygen deficiency, a metal oxide powder may be heat-treated in a reducing atmosphere, and then a deposition process may be performed thereon.

In order to adjust the amount of grain boundaries, it is preferable to control heating when forming the layer or film, a layer/film forming rate, heat treatment in a subsequent step, and the like. By controlling these, the average crystal grain size can be controlled.

EXAMPLES

Examples 1 to 7

P-type $BaSi_2$ layers were prepared as the P-type semiconductor. N-type $WO_3$ layers were prepared as the N-type semiconductor. $SiO_2$ layers were prepared as the first insulating layer.

For the P-type $BaSi_2$ layers, prepared were layers varying in an impurity doping amount or a grain boundary amount. Further, the thickness of the P-type $BaSi_2$ layers was unified to 0.5 μm (500 nm). For the N-type $WO_3$ layers, prepared were layers varying in an oxygen deficiency amount or a grain boundary amount. Further, the thickness of the N-type $WO_3$ layers was unified to 0.5 μm (500 nm). In this manner, the introduction of the capture level was adjusted.

As first insulating layers, films of varying thickness were prepared, by varying the sputtering condition of $SiO_2$. The film density of the $SiO_2$ films was unified to 95%, and the dielectric constant of the $SiO_2$ films was unified to 3.8. The film density described herein is the film density with respect to the true density. That is, in Examples 1 to 7, the density of the first insulating layers was unified to 95% of the true density of $SiO_2$.

The areas of the semiconductor layers and the insulating layers were all unified to 4 $cm^2$. Regarding the position of the capture level, the position when the width (Ec-Ev) of the band gap is taken to be 100, more specifically, when the bottom Ec of the conduction band was taken as 100 and the top Ev of the valence band was taken as 0, was unified to 1 to 3 for the P-type semiconductors and was unified to 97 to 99 for the N-type semiconductors. The level positions shown herein are expressed as the range from the minimum value to the maximum value obtained when measuring the same target three times by the above-described method.

Further, Al electrodes were provided as first and second electrodes. Thereby, semiconductor solid state batteries having the structures shown in Table 1 were manufactured.

95%, and the dielectric constant was unified to 3.8. Further, the first and second electrode layers were unified to Al layers.

In this manner, semiconductor solid state batteries according to Examples 8 to 15 were manufactured.

TABLE 2

| | Second insulating layer Film thickness (nm) | N-type semiconductor/First insulating layer/P-type semiconductor | Third insulating layer Film thickness (nm) |
|---|---|---|---|
| Example 8 | 1 | Example 2 | 1 |
| Example 9 | 5 | Example 2 | 5 |
| Example 10 | 3 | Example 3 | 3 |
| Example 11 | 10 | Example 3 | 10 |
| Example 12 | 4 | Example 4 | 4 |
| Example 13 | 6 | Example 4 | 6 |
| Example 14 | 8 | Example 5 | 8 |
| Examole 15 | 20 | Example 5 | 20 |

The energy density and the voltage drop of the semiconductor solid state batteries according to Examples 1 to 15 were measured.

In order to measure the energy density, using a charge and discharge device, charge was performed to a voltage of 2.0 V with a constant current, and successive discharge to 0 V was performed with a constant current. The capacities (mAh) of the semiconductor solid state batteries was obtained from the electrical capacities at the time of discharge.

For each of the semiconductor solid state batteries, the product between the obtained capacity and the average discharge voltage (V) was calculated, and by further dividing the product by the weight of power storage unit, the energy density represented by Wh/kg was obtained. Here, the weight of the power storage unit represents the total weight of the semiconductor layer and the insulating layer, excluding the substrate (the substrate used when forming the semiconductor layer) and the electrode layers.

Further, the product between the capacity (mAh) of semiconductor solid state battery and the average discharge

TABLE 1

| | N-type semiconductor | | | First insulating layer | P-type semiconductor | | |
|---|---|---|---|---|---|---|---|
| | Material | Oxygen deficiency amount ($cm^{-3}$) | Crystallite size (nm) | Film thickness of $SiO_2$ (nm) | Material | Impurity amount ($cm^{-3}$) | Crystallite size (nm) |
| Example 1 | $WO_3$ | $2 \times 10^{16}$ | 20 | 3 | $BaSi_2$ | $1 \times 10^{16}$ | 30 |
| Example 2 | $WO_3$ | $5 \times 10^{18}$ | 130 | 15 | $BaSi_2$ | $3 \times 10^{18}$ | 80 |
| Example 3 | $WO_3$ | $6 \times 10^{19}$ | 1500 | 50 | $BaSi_2$ | $2 \times 10^{19}$ | 1800 |
| Example 4 | $WO_3$ | $4 \times 10^{20}$ | 800 | 200 | $BaSi_2$ | $6 \times 10^{19}$ | 900 |
| Example 5 | $WO_3$ | $2 \times 10^{21}$ | 400 | 800 | $BaSi_2$ | $1 \times 10^{21}$ | 500 |
| Example 6 | $WO_3$ | $5 \times 10^{18}$ | 10 | 5500 | $BaSi_2$ | $3 \times 10^{18}$ | 10 |
| Example 7 | $WO_3$ | $2 \times 10^{17}$ | 3000 | 40000 | $BaSi_2$ | $3 \times 10^{17}$ | 3000 |

Examples 8 to 15

Second insulating layers and third insulating layers shown in Table 2 were provided to the semiconductor solid state batteries according to Examples 2 to 5. The second insulating layers and the third insulating layers were unified to $SiO_2$ layers, the density of the layers (film density) was unified to voltage (V) was calculated, and by further dividing the product by the area 4 $cm^2$ of power storage unit, the energy density represented by μWh/$cm^2$ was obtained. Here, the area of the power storage unit represents the average area of the semiconductor layer and the insulating layer, excluding the substrate and the electrode layer.

The measurement of the voltage drop was performed as follows. First, the charge was performed by applying a constant voltage of 1.5 V to the battery for 50 seconds by using a voltage source. Immediately after that, by performing switching within the circuit and the like, a connection with the voltage source was cut off and instead, a constant load resistor of 0.9 MΩ was connected in series to the battery. The battery voltage was monitored by a voltmeter to measure the voltage drop (V) immediately after the connection to the constant load resistor of 0.9 MΩ.

The results are shown in Table 3.

TABLE 3

| | Energy density ① (Wh/kg) | Energy density ② (μWh/cm$^2$) | Voltage drop (V) |
|---|---|---|---|
| Example 1 | 0.14 | 0.06 | 0.71 |
| Example 2 | 0.63 | 0.28 | 0.66 |
| Example 3 | 1.47 | 0.67 | 0.58 |
| Example 4 | 1.67 | 0.87 | 0.55 |
| Example 5 | 1.91 | 1.25 | 0.47 |
| Example 6 | 0.31 | 0.58 | 0.72 |
| Example 7 | 0.02 | 0.17 | 0.69 |
| Example 8 | 0.66 | 0.31 | 0.68 |
| Example 9 | 0.79 | 0.36 | 0.71 |
| Example 10 | 1.84 | 0.87 | 0.62 |
| Example 11 | 1.69 | 0.74 | 0.78 |

TABLE 3-continued

| | Energy density ① (Wh/kg) | Energy density ② (μWh/cm$^2$) | Voltage drop (V) |
|---|---|---|---|
| Example 12 | 2.09 | 1.13 | 0.58 |
| Example 13 | 1.92 | 0.96 | 0.61 |
| Example 14 | 2.39 | 1.63 | 0.49 |
| Examole 15 | 1.15 | 0.63 | 0.82 |

As can be seen from the table, in the semiconductor solid state batteries according to the Examples, the energy density was improved and the voltage drop was suppressed. Further, by controlling the capture level amount or the crystallite size, the energy density reached 1.91 Wh/kg and 1.25 μWh/cm$^2$, and a voltage drop of 0.47 V was accomplished. Further, by providing the second insulating layer and the third insulating layer, the energy density was increased up to 2.39 Wh/kg and 1.63 μWh/cm$^2$.

Examples 16 to 22

P-type BaSi$_2$ layers were prepared as the P-type semiconductor. N-type BaSi$_2$ layers were prepared as the N-type semiconductor. Si$_3$N$_4$ layers were prepared as the first insulating layer.

For the P-type BaSi$_2$ layers and the N-type BaSi$_2$ layers, layers varying in impurity doping amount or a grain boundary amount were prepared. Further, the thicknesses of the P-type BaSi$_2$ layers and the N-type BaSi$_2$ layers were unified to 0.5 μm (500 nm). In this manner, the introduction of the capture level was adjusted.

As first insulating layers, films of varying thickness were prepared by varying the sputtering condition of Si$_3$N$_4$. The film density of the Si$_3$N$_4$ films was unified to 93%, and the dielectric constant of the Si$_3$N$_4$ films was unified to 7.5.

The areas of the semiconductor layers and the insulating layers were all unified to 4 cm$^2$. Regarding the level position, the positions were unified to 1 to 3 for the P-type semiconductors, and the positions were unified to 97 to 99 for the N-type semiconductors.

Al electrodes were provided as the first and second electrodes. Thereby, semiconductor solid state batteries having the structures shown in Table 4 were manufactured.

TABLE 4

| | N-type semiconductor | | | First insulating layer | P-type semiconductor | | |
|---|---|---|---|---|---|---|---|
| | Material | Oxygen deficiency amount (cm$^{-3}$) | Crystallite size (nm) | Film thickness of SiO$_2$ (nm) | Material | Impurity amount (cm$^{-3}$) | Crystallite size (nm) |
| Example 16 | BaSi$_2$ | $4 \times 10^{15}$ | 10 | 2 | BaSi$_2$ | $9 \times 10^{15}$ | 15 |
| Example 17 | BaSi$_2$ | $7 \times 10^{18}$ | 100 | 20 | BaSi$_2$ | $2 \times 10^{18}$ | 70 |
| Example 18 | BaSi$_2$ | $4 \times 10^{19}$ | 1300 | 50 | BaSi$_2$ | $2 \times 10^{19}$ | 1200 |
| Example 19 | BaSi$_2$ | $2 \times 10^{20}$ | 600 | 200 | BaSi$_2$ | $9 \times 10^{19}$ | 800 |
| Example 20 | BaSi$_2$ | $3 \times 10^{21}$ | 400 | 800 | BaSi$_2$ | $2 \times 10^{21}$ | 300 |
| Example 21 | BaSi$_2$ | $7 \times 10^{18}$ | 10 | 6000 | BaSi$_2$ | $2 \times 10^{18}$ | 10 |
| Example 22 | BaSi$_2$ | $3 \times 10^{17}$ | 2800 | 35000 | BaSi$_2$ | $3 \times 10^{17}$ | 2900 |

Examples 23 to 30

Second insulating layers and third insulating layers shown in Table 5 were provided to the semiconductor solid state batteries according to Examples 17 to 20. The second insulating layers and the third insulating layers were unified to Si$_3$N$_4$ layers, the density of the layers (film density) was unified to 93%, and the dielectric constant was unified to 7.5. Further, the first and second electrode layers were unified to Al layers.

In this manner, semiconductor solid state batteries according to Examples 23 to 30 were manufactured.

TABLE 5

| | Second insulating layer Film thickness (nm) | N-type semiconductor/First insulating layer/P-type semiconductor | Third insulating layer Film thickness (nm) |
|---|---|---|---|
| Example 23 | 2 | Example 17 | 2 |
| Example 24 | 6 | Example 17 | 6 |

TABLE 5-continued

| | Second insulating layer Film thickness (nm) | N-type semiconductor/First insulating layer/P-type semiconductor | Third insulating layer Film thickness (nm) |
|---|---|---|---|
| Example 25 | 3 | Example 18 | 3 |
| Example 26 | 12 | Example 18 | 12 |
| Example 27 | 4 | Example 19 | 4 |
| Example 28 | 5 | Example 19 | 5 |
| Example 29 | 7 | Example 20 | 7 |
| ExamDle 30 | 18 | Example 20 | 18 |

The energy density and the voltage drop of the semiconductor solid state batteries according to Examples 16 to 30 were measured. The measurement method was the same as that for Example 1. The results are shown in Table 6.

TABLE 6

| | Energy density ① (Wh/kg) | Energy density ② ($\mu$Wh/cm$^2$) | Voltage drop (V) |
|---|---|---|---|
| Example 16 | 0.34 | 0.06 | 0.67 |
| Example 17 | 1.54 | 0.26 | 0.61 |
| Example 18 | 2.90 | 0.52 | 0.54 |
| Example 19 | 3.07 | 0.76 | 0.51 |
| Example 20 | 2.74 | 1.04 | 0.46 |
| Example 21 | 0.27 | 0.44 | 0.62 |
| Example 22 | 0.02 | 0.16 | 0.61 |
| Example 23 | 1.69 | 0.30 | 0.64 |
| Example 24 | 2.00 | 0.35 | 0.68 |
| Example 25 | 3.77 | 0.65 | 0.57 |
| Example 26 | 3.48 | 0.61 | 0.75 |
| Example 27 | 3.78 | 0.95 | 0.55 |
| Example 28 | 3.62 | 0.87 | 0.56 |
| Example 29 | 3.34 | 1.30 | 0.49 |
| Examole 30 | 1.31 | 0.47 | 0.83 |

As can be seen from the table, in the semiconductor solid state batteries according to the Examples, the energy density was improved and the voltage drop was suppressed. Further, by controlling the capture level amount or the crystallite size, the energy density reached 3.07 Wh/kg and 1.04 $\mu$Wh/cm$^2$, and a voltage drop of 0.46 V or less had been accomplished. Further, by providing the second insulating layer and the third insulating layer, the energy density was increased to 3.78 Wh/kg and 1.30 $\mu$Wh/cm$^2$.

Examples 31 to 37

Poly-Si (polycrystalline silicon) layers were prepared as the P-type semiconductor. N-type BaSi$_2$ layers were prepared as the N-type semiconductor. SiO$_2$ layers were prepared as the first insulating layer.

For the P-type poly-Si layer and the N-type BaSi$_2$ layer, layers varying in an impurity doping amount or a grain boundary amount were prepared. Further, the thicknesses of the P-type poly-Si layers and the N-type BaSi$_2$ layers were unified to 0.5 $\mu$m (500 nm). In this manner, the introduction of the capture level was adjusted.

Further, as first insulating layers, films of varying thickness were prepared by varying the sputtering condition of SiO$_2$. The film density of the SiO$_2$ films was unified to 95%, and the dielectric constant of the SiO$_2$ films was unified to 3.8.

The areas of the semiconductor layers and the insulating layers were all unified to 4 cm$^2$. Regarding the level position, the positions were unified to 1 to 3 for the P-type semiconductors, and the positions were unified to 97 to 99 for the N-type semiconductors.

Al electrodes were provided as the first and second electrodes. Thereby, semiconductor solid state batteries having the structures shown in Table 7 were manufactured.

TABLE 7

| | N-type semiconductor | | | First insulating layer | P-type semiconductor | | |
|---|---|---|---|---|---|---|---|
| | Material | Impurity amount (cm$^{-3}$) | Crystallite size (nm) | Film thickness of SiO$_2$ (nm) | Material | Impurity amount (cm$^{-3}$) | Crystallite size (nm) |
| Example 31 | BaSi$_2$ | $2 \times 10^{15}$ | 8 | 4 | Poly-Si | $9 \times 10^{15}$ | 12 |
| Example 32 | BaSi$_2$ | $6 \times 10^{18}$ | 110 | 18 | Poly-Si | $5 \times 10^{18}$ | 65 |
| Example 33 | BaSi$_2$ | $2 \times 10^{19}$ | 1350 | 45 | Poly-Si | $3 \times 10^{19}$ | 1100 |
| Example 34 | BaSi$_2$ | $6 \times 10^{20}$ | 650 | 220 | Poly-Si | $8 \times 10^{19}$ | 700 |
| Example 35 | BaSi$_2$ | $3 \times 10^{21}$ | 350 | 900 | Poly-Si | $3 \times 10^{21}$ | 300 |
| Example 36 | BaSi$_2$ | $5 \times 10^{18}$ | 15 | 5800 | Poly-Si | $1 \times 10^{18}$ | 15 |
| Example 37 | BaSi$_2$ | $2 \times 10^{17}$ | 2800 | 42000 | Poly-Si | $5 \times 10^{17}$ | 2900 |

Examples 38 to 45

Second insulating layers and third insulating layers shown in Table 8 were provided to the semiconductor solid state batteries according to Examples 32 to 35. The second insulating layers and the third insulating layers were unified to $SiO_2$ layers, the density of the layers (film density) was unified to 95%, and the dielectric constant was unified to 3.8. Further, the first and second electrode layers were unified to Al layers.

In this manner, semiconductor solid state batteries according to Examples 38 to 45 were manufactured.

TABLE 8

| | Second insulating layer Film thickness (nm) | N-type semiconductor/First insulating layer/P-type semiconductor | Third insulating layer Film thickness (nm) |
|---|---|---|---|
| Example 38 | 1 | Example 32 | 1 |
| Example 39 | 5 | Example 32 | 5 |
| Example 40 | 3 | Example 33 | 3 |
| Example 41 | 10 | Example 33 | 10 |
| Example 42 | 4 | Example 34 | 4 |
| Example 43 | 6 | Example 34 | 6 |
| Example 44 | 9 | Example 35 | 9 |
| Example 45 | 22 | Example 35 | 22 |

The energy density and the voltage drop of the semiconductor solid state batteries according to Examples 31 to 45 were measured. The measurement method was the same as that for Example 1. The results are shown in Table 9.

TABLE 9

| | Energy density ① (Wh/kg) | Energy density ② (µWh/cm$^2$) | Voltage drop (V) |
|---|---|---|---|
| Example 31 | 0.39 | 0.08 | 0.80 |
| Example 32 | 1.59 | 0.32 | 0.75 |
| Example 33 | 4.71 | 1.01 | 0.66 |
| Example 34 | 4.14 | 1.16 | 0.62 |
| Example 35 | 3.55 | 1.46 | 0.50 |
| Example 36 | 0.41 | 0.68 | 0.81 |
| Example 37 | 0.02 | 0.19 | 0.77 |
| Example 38 | 1.83 | 0.35 | 0.79 |
| Example 39 | 1.99 | 0.42 | 0.83 |
| Example 40 | 6.17 | 1.31 | 0.70 |
| Example 41 | 5.75 | 1.21 | 0.88 |
| Example 42 | 5.22 | 1.47 | 0.67 |
| Example 43 | 5.17 | 1.39 | 0.68 |
| Example 44 | 4.37 | 1.76 | 0.54 |
| Example 45 | 1.95 | 0.73 | 0.85 |

As can be seen from the table, in the semiconductor solid state batteries according to the Examples, the energy density was improved and the voltage drop was suppressed. Further, by controlling the capture level amount or the crystallite size, the energy density reached 4.71 Wh/kg and 1.46 µWh/cm$^2$, and a voltage drop of 0.50 V was accomplished. Further, by providing the second insulating layer and the third insulating layer, the energy density was increased up to 6.17 Wh/kg and 1.76 µWh/cm$^2$.

Further, even when the materials of the N-type semiconductor and the P-type semiconductor were changed, the properties were improved by introducing the capture level.

Examples 46 to 52

P-type NiO layers into which Ni deficiency was introduced were prepared as the P-type semiconductor. N-type $TiO_2$ layers into which O deficiency was introduced were prepared as the N-type semiconductor. SiON layers were prepared as the first insulating layer.

For the P-type NiO layers, layers varying in Ni deficiency amount, level position, and grain boundary amount were prepared. With regard to the Ni deficiency amount and the level position, the Ni defect levels were provided by controlling the partial pressure of oxygen when forming a part of the P-type NiO layers. Further, the thickness of the P-type NiO layers was unified to 0.5 µm (500 nm). For the N-type $TiO_2$ layer, layers varying in O deficiency amount, level position, and grain boundary amount were prepared. With regard to the O deficiency amount and the level position, the O defect levels were provided by controlling the partial pressure of oxygen when forming a part of the N-type $TiO_2$ layer. Further, the thickness of the N-type $TiO_2$ layers was unified to 0.5 µm (500 nm).

As first insulating layers, films of varying thickness were prepared by varying the sputtering condition of SiON. The film density of the SiON films was unified to 90%, and the dielectric constant of the SiON films was unified to 7.3.

Au/Ti was used as the negative electrodes on the $TiO_2$ layer side, and ITO was used as the positive electrodes on the NiO layer side. The areas of the semiconductor layers and the insulating layers were all unified to 4 cm$^2$. The level position was made to be in the range shown in Table 10. The level positions shown in Table 10 are expressed as the range from the minimum value to the maximum value obtained when measuring the same target three times. Thereby, semiconductor solid state batteries having the structures shown in Table 10 were manufactured.

TABLE 10

| | N-type semiconductor | | | | First insulating layer |
|---|---|---|---|---|---|
| | Material | Oxygen deficiency amount (cm$^{-3}$) | Level position | Crystallite size (nm) | Film thickness of $SiO_2$ (nm) |
| Example 46 | $TiO_2$ | $2 \times 10^{16}$ | 91~96 | 20 | 3 |
| Example 47 | $TiO_2$ | $5 \times 10^{19}$ | 91~96 | 130 | 15 |
| Example 48 | $TiO_2$ | $6 \times 10^{20}$ | 70~75 | 1500 | 50 |
| Example 49 | $TiO_2$ | $4 \times 10^{18}$ | 70~75 | 800 | 300 |
| Example 50 | $TiO_2$ | $2 \times 10^{21}$ | 70~75 | 400 | 800 |
| Example 51 | $TiO_2$ | $5 \times 10^{18}$ | 70~75 | 10 | 5500 |
| Example 52 | $TiO_2$ | $2 \times 10^{17}$ | 70~75 | 3000 | 40000 |

| | P-type semiconductor | | | |
|---|---|---|---|---|
| | Material | Ni deficiency amount (cm$^{-3}$) | Level position | Crystallite size (nm) |
| Example 46 | NiO | $1 \times 10^{16}$ | 4~9 | 30 |
| Example 47 | NiO | $3 \times 10^{19}$ | 4~9 | 80 |
| Example 48 | NiO | $2 \times 10^{20}$ | 20~25 | 1800 |
| Example 49 | NiO | $6 \times 10^{18}$ | 20~25 | 900 |
| Example 50 | NiO | $1 \times 10^{21}$ | 20~25 | 500 |
| Example 51 | NiO | $3 \times 10^{18}$ | 20~25 | 10 |
| Example 52 | NiO | $3 \times 10^{17}$ | 20~25 | 3000 |

Examples 53 to 60

Second insulating layers and third insulating layers shown in Table 11 were provided to the semiconductor solid state batteries according to Examples 46 to 52. The second insulating layers and the third insulating layer were unified to SiON layers, the density of the layers (film density) was unified to 90%, and the dielectric constant was unified to 7.3. Further, the electrode layers were unified to Au/Ti as the negative electrodes on the $TiO_2$ layer side and to ITO as the positive electrodes on the NiO layer side.

In this manner, semiconductor solid state batteries according to Examples 53 to 60 were manufactured.

TABLE 11

|  | Second insulating layer Film thickness (nm) | N-type semiconductor/First insulating layer/P-type semiconductor | Third insulating layer Film thickness (nm) |
| --- | --- | --- | --- |
| Example 53 | 1 | Example 47 | 1 |
| Example 54 | 5 | Example 47 | 5 |
| Example 55 | 3 | Example 48 | 3 |
| Example 56 | 10 | Example 48 | 10 |
| Example 57 | 4 | Example 49 | 4 |
| Example 58 | 6 | Example 49 | 6 |
| Example 59 | 8 | Example 50 | 8 |
| Example 60 | 20 | Example 50 | 20 |

Comparative Example 1

A semiconductor solid state battery was manufactured as follows by using a thin film in which a metal oxide semiconductor material and an insulating material were mixed. A coating solution prepared by mixing fatty acid titanium and silicone oil in a solvent and stirring the mixture was spin-coated to form a charge layer (1 μm). After drying, the charge layer was heated at 350° C. for 30 minutes to obtain a mixture film of $TiO_2$ and silicone. Further, ultraviolet irradiation with a wavelength of 254 nm and an intensity of 20 mW/cm$^2$ was performed for about 40 minutes to introduce a capture level. A block layer NiO (150 nm) was formed on top of the charge layer. ITO was used for both the positive electrode and the negative electrode, and the area of the charge layer and the block layer was set to 4 cm$^2$. In this manner, a semiconductor solid state battery as Comparative Example 1 was manufactured.

The energy density and the voltage drop of the semiconductor solid state batteries according to Examples 46 to 60 and Comparative Example 1 were measured. The measurement method was the same as that for Example 1. The results are shown in Table 12.

TABLE 12

|  | Energy density ① (Wh/kg) | Energy density ② (μWh/cm$^2$) | Voltage drop (V) |
| --- | --- | --- | --- |
| Example 46 | 0.18 | 0.10 | 0.55 |
| Example 47 | 1.10 | 0.60 | 0.49 |
| Example 48 | 2.33 | 1.30 | 0.45 |
| Example 49 | 2.86 | 1.80 | 0.41 |
| Example 50 | 3.12 | 2.40 | 0.35 |
| Example 51 | 0.53 | 1.10 | 0.61 |
| Example 52 | 0.03 | 0.40 | 0.53 |
| Example 53 | 1.26 | 0.66 | 0.5 |
| Example 54 | 1.37 | 0.78 | 0.53 |
| Example 55 | 3.09 | 1.69 | 0.48 |
| Example 56 | 2.63 | 1.43 | 0.66 |
| Example 57 | 3.75 | 2.34 | 0.4 |
| Example 58 | 3.09 | 1.98 | 0.42 |
| Example 59 | 3.99 | 3.12 | 0.44 |
| Example 60 | 1.50 | 1.20 | 0.72 |
| Comparative Example 1 | 0.18 | 0.44 | 1.29 |

As can be seen from the table, in the semiconductor solid state batteries according to Examples 47 to 51 and 53 to 60, the energy density was improved and the voltage drop was suppressed, as compared with Comparative Example 1. Further, by introducing deep capture levels, the energy density reached 3.12 Wh/kg or more and 2.4 μWh/cm$^2$, and the voltage drop had been suppressed to 0.35 V. Even when compared with Examples 1 to 45, there was improvement in the energy density in μWh/kg, obtained with the area of the power storage unit unified to 4 cm$^2$. Regarding the energy density in Wh/kg unit, some examples have maximum performance values that are inferior in comparison to Examples 1 to 45. This is considered to be due to a difference in the film density having been caused by the difference in the semiconductor material and insulating layer material used.

Figure 8:
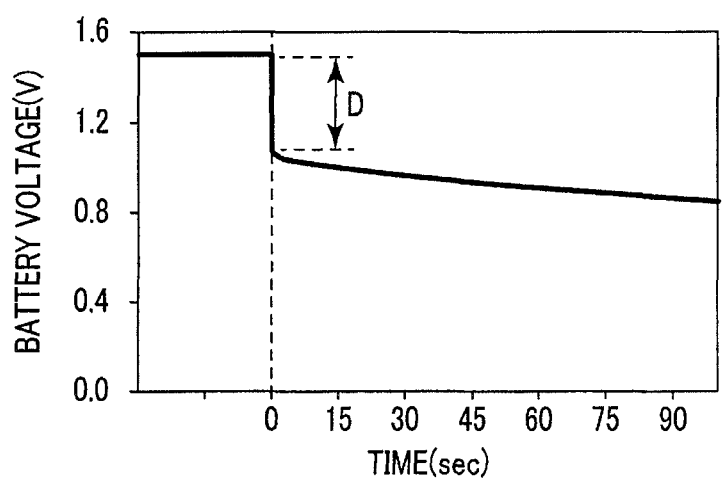
FIG. 8 is a graph showing a discharge curve of a semiconductor solid state battery of Example 49.

Further, the discharge curve at the time of measuring the voltage drop in Example 49 is shown in FIG. 8. In the graph of FIG. 8 showing the discharge curve, the horizontal axis represents the time and the vertical axis represents the battery voltage. In the time shown on the horizontal axis, the discharge start time, that is, the time when the connection of the battery was switched from the connection with the voltage source (1.5 V constant voltage) to the connection with the constant load resistor (0.9 MΩ), was set to zero. As shown in FIG. 8, the battery voltage rapidly decreases from 1.5 V to 1.01 V at the discharge start time (time: 0 sec). The voltage decrease amount is represented by a voltage drop D.

As can be seen from FIG. 8, when the voltage drop D is suppressed, the operating voltage immediately after the start of the discharge can be increased. This also leads to an increase in the battery capacity. Further, as shown in Examples 53 to 60, the energy density reached 3.99 Wh/kg and 3.12 μWh/cm$^2$ by providing the second insulating layer and the third insulating layer.

Examples 61 to 67

As the P-type semiconductor, prepared were P-type β-$FeSi_2$ layers in which a composition ratio of Fe/Si was controlled. N-type $TiO_2$ layers were prepared as the N-type semiconductor. $HfO_2$ layers were prepared as the first insulating layer.

The P-type β-$FeSi_2$ layers were formed by co-vapor deposition using an Fe target and a Si target. For the co-vapor deposition, a deposition rate was adjusted to Fe:Si=1:2 or Fe:Si=1:2.25, and heat treatment was performed at 800° C. for 5 minutes in a forming gas. In this manner, a Fe/Si composition ratio, a level position, and a grain boundary amount were varied. Further, the thickness of the P-type β-$FeSi_2$ layer was unified to 0.5 μm (500 nm).

For the N-type $TiO_2$ layer, layers varying in O deficiency amount, level position, and grain boundary amount were prepared. A part of the N-type $TiO_2$ layers was heat-treated in a vacuum atmosphere to provide O defect levels. Further, the thickness of the N-type $TiO_2$ layers was unified to 0.5 μm (500 nm).

As first insulating layers, films varying in thickness were prepared by varying the sputtering condition of $HfO_2$. The film density of the $HfO_2$ films was unified to 95%, and the dielectric constant of the $HfO_2$ films was unified to 25.0.

Au/Ti was used as the negative electrodes on the $TiO_2$ layer side, and ITO was used as the positive electrodes on the β-$FeSi_2$ layer side. The areas of the semiconductor layers and the insulating layers were all unified to 4 cm$^2$. The level position was made to be in the range shown in Table 13.

Thereby, semiconductor solid state batteries having the structures shown in Table 13 were manufactured.

TABLE 13

| | N-type semiconductor | | | First insulating layer |
|---|---|---|---|---|
| Material | Oxygen deficiency amount ($cm^{-3}$) | Level position | Crystallite size (nm) | Film thickness of $HfO_2$ (nm) |
| Example 61 | $TiO_2$ | $4 \times 10^{15}$ | 91~96 | 10 | 2 |
| Example 62 | $TiO_2$ | $7 \times 10^{18}$ | 91~96 | 100 | 20 |
| Example 63 | $TiO_2$ | $4 \times 10^{19}$ | 70~75 | 1300 | 50 |
| Example 64 | $TiO_2$ | $2 \times 10^{20}$ | 70~75 | 600 | 200 |
| Example 65 | $TiO_2$ | $3 \times 10^{21}$ | 70~75 | 400 | 800 |
| Example 66 | $TiO_2$ | $7 \times 10^{18}$ | 70~75 | 10 | 6000 |
| Example 67 | $TiO_2$ | $3 \times 10^{17}$ | 70~75 | 2800 | 35000 |

| | P-type semiconductor | | | |
|---|---|---|---|---|
| Material | Composition ($cm^{-3}$) | Level position | Crystallite size (nm) | |
| Example 61 | β-$FeSi_2$ | Fe:Si = 1:2 | 4~9 | 15 |
| Example 62 | β-$FeSi_2$ | Fe:Si = 1:2 | 4~9 | 70 |
| Example 63 | β-$FeSi_2$ | Fe:Si = 1:2.25 | 20~25 | 1200 |
| Example 64 | β-$FeSi_2$ | Fe:Si = 1:2.25 | 20~25 | 800 |
| Example 65 | β-$FeSi_2$ | Fe:Si = 1:2.25 | 20~25 | 300 |
| Example 66 | β-$FeSi_2$ | Fe:Si = 1:2.25 | 20~25 | 10 |
| Example 67 | β-$FeSi_2$ | Fe:Si = 1:2.25 | 20~25 | 2900 |

The energy density and the voltage drop of the semiconductor solid state batteries according to Examples 61 to 67 were measured. The measurement method was the same as that for Example 1. The results are shown in Table 14.

TABLE 14

| | Energy density ① (Wh/kg) | Energy density ② (μWh/$cm^2$) | Voltage drop (V) |
|---|---|---|---|
| Example 61 | 0.20 | 0.09 | 0.52 |
| Example 62 | 1.25 | 0.57 | 0.44 |
| Example 63 | 2.09 | 1.04 | 0.43 |
| Example 64 | 2.07 | 1.53 | 0.35 |
| Example 65 | 1.67 | 2.04 | 0.33 |
| Example 66 | 0.14 | 0.83 | 0.52 |
| Example 67 | 0.01 | 0.38 | 0.48 |

As can be seen from the table, in the semiconductor solid state batteries according to Examples 62 to 66, the energy density was improved and the voltage drop was suppressed. Further, by introducing the capture level at a deep level, the energy density reached 2.09 Wh/kg and 2.04 μWh/$cm^2$, and the voltage drop had been suppressed to 0.33 V.

Examples 68 to 74

P-type a-Si:H layers were prepared as the P-type semiconductor. N-type $TiO_2$ layers were prepared as the N-type semiconductor. $HfO_2$ layers were prepared as the first insulating layer.

The P-type a-Si:H layers were formed by plasma CVD using diborane ($B_2H_6$) gas, and layers varying in impurity doping amount, level position, and grain boundary amount were prepared. Further, the thicknesses of the P-type a-Si:H layers and the N-type $TiO_2$ layers were unified to 0.5 μm (500 nm).

In the N-type $TiO_2$ layer, the O defect level was provided to the $TiO_2$ semiconductor as follows. In Examples 68 and 69, oxygen deficiency was provided by annealing after forming the layer. In Examples 70 to 74, the surface of the N-type $TiO_2$ layer was subjected to laser treatment to provide O defect levels only near the surface.

As first insulating layers, films varying in film thickness were prepared by varying the sputtering condition of $SiO_2$. The film density of the $HfO_2$ film was unified to 95%, and the dielectric constant of the $HfO_2$ film was unified to 25.

Au/Ti was used as the negative electrodes on the $TiO_2$ layer side, and ITO was used as the positive electrodes on the a-Si:H layer side. The areas of the semiconductor layers and the insulating layers were all unified to 4 $cm^2$. The level position was made to be in the range shown in Tables 15 and 16. Thereby, semiconductor solid state batteries having the structures shown in Tables 15 and 16 were manufactured.

TABLE 15

| | N-type semiconductor | | | First insulating layer |
|---|---|---|---|---|
| Material | Oxygen deficiency amount ($cm^{-3}$) | Level position | Crystallite size (nm) | Film thickness of $HfO_2$ (nm) |
| Example 68 | $TiO_2$ | $2 \times 10^{15}$ | 91~96 | 8 | 4 |
| Example 69 | $TiO_2$ | $6 \times 10^{18}$ | 91~96 | 110 | 18 |

| | P-type semiconductor | | |
|---|---|---|---|
| Material | Ni deficiency amount ($cm^{-3}$) | Level position | Crystallite size (nm) |
| Example 68 | a-Si:H | $9 \times 10^{15}$ | 4~9 | 12 |
| Example 69 | a-Si:H | $5 \times 10^{18}$ | 4~9 | 65 |

TABLE 16

N-type semiconductor *O deficiency amount and level position are values to depth of 100 nm from surface

| | N-type semiconductor | | | First insulating layer |
|---|---|---|---|---|
| Material | Oxygen deficiency amount ($cm^{-3}$) | Level position | Crystallite size (nm) | Film thickness of $HfO_2$ (nm) |
| Example 70 | $TiO_2$ | $2 \times 10^{19}$ | 70~75 | 1350 | 45 |
| Example 71 | $TiO_2$ | $6 \times 10^{20}$ | 70~75 | 650 | 220 |
| Example 72 | $TiO_2$ | $3 \times 10^{21}$ | 70~75 | 350 | 900 |
| Example 73 | $TiO_2$ | $5 \times 10^{18}$ | 70~75 | 15 | 5800 |
| Example 74 | $TiO_2$ | $2 \times 10^{17}$ | 70~75 | 2800 | 42000 |

| | P-type semiconductor | | |
|---|---|---|---|
| Material | Ni deficiency amount ($cm^{-3}$) | Level position | Crystallite size (nm) |
| Example 70 | a-Si:H | $3 \times 10^{19}$ | 25~30 | 1100 |
| Example 71 | a-Si:H | $8 \times 10^{19}$ | 25~30 | 700 |
| Example 72 | a-Si:H | $3 \times 10^{21}$ | 25~30 | 300 |
| Example 73 | a-Si:H | $1 \times 10^{18}$ | 25~30 | 15 |
| Example 74 | a-Si:H | $5 \times 10^{17}$ | 25~30 | 2900 |

The energy density and the voltage drop of the semiconductor solid state batteries according to Examples 68 to 74 were measured. The measurement method was the same as that for Example 1. The results are shown in Table 17.

TABLE 17

|  | Energy density ① (Wh/kg) | Energy density ② (μWh/cm²) | Voltage drop (V) |
|---|---|---|---|
| Example 68 | 0.41 | 0.14 | 0.61 |
| Example 69 | 2.18 | 0.72 | 0.56 |
| Example 70 | 4.95 | 1.69 | 0.50 |
| Example 71 | 5.74 | 2.34 | 0.45 |
| Example 72 | 5.33 | 2.88 | 0.37 |
| Example 73 | 0.74 | 1.32 | 0.67 |
| Examcle 74 | 0.04 | 0.46 | 0.61 |

As can be seen from the table, in the semiconductor solid state batteries according to Examples 69 to 73, the energy density was improved and the voltage drop was suppressed. Further, by introducing the capture level at a deep level, the energy density reached 5.74 Wh/kg and 2.88 μWh/cm², and the voltage drop had been suppressed to 0.37 V.

Examples 75 and 76

A semiconductor solid state battery in which the N-type semiconductor layer of Example 4 was replaced with the N-type semiconductor layer of Example 49 was manufactured as Example 75. Further, a semiconductor solid state battery in which the P-type semiconductor layer of Example 4 was replaced with the P-type semiconductor layer of Example 49 was manufactured as Example 76.

The energy density and the voltage drop of the semiconductor solid state batteries according to Examples 75 and 76 were measured. The measurement method was the same as that for Example 1. The results are shown in Table 18.

TABLE 18

|  | Energy density ① (Wh/kg) | Energy density ② (μWh/cm²) | Voltage drop (V) |
|---|---|---|---|
| Example 75 | 1.24 | 0.50 | 2.11 |
| Example 76 | 1.15 | 0.54 | 1.95 |

As can be seen from the table, in the semiconductor solid state batteries according to Examples 75 and 76, the energy density was improved and the voltage drop was suppressed. The energy density improvement and the voltage drop suppression had been confirmed, even when the capture level position was made deeper only in one between the N-type semiconductor layer and the P-type semiconductor layer.

Further, properties were improved by controlling the first insulating layer, the second insulating layer, and the third insulating layer. Further, even when the materials of the N-type semiconductor and the P-type semiconductor were changed, properties were improved by introducing the capture level.

According to at least one embodiment and Example described above, there is provided the semiconductor solid state battery including the N-type semiconductor, the P-type semiconductor, and the first insulating layer, the first insulating layer being provided between the N-type semiconductor and the P-type semiconductor. The semiconductor solid state battery has a high energy density and a low voltage drop.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor solid state battery comprising:
an N-type semiconductor;
a P-type semiconductor; and
a first insulating layer provided between the N-type semiconductor and the P-type semiconductor,
wherein the first insulating layer has a thickness of 3 nm to 30 μm and a dielectric constant of 50 or less.

2. The semiconductor solid state battery according to claim 1, wherein the first insulating layer has a dielectric constant of 10 or less.

3. The semiconductor solid state battery according to claim 1, wherein the first insulating layer has a density of 60% or more of a true density thereof.

4. The semiconductor solid state battery according to claim 1, wherein at least one of the N-type semiconductor and the P-type semiconductor is made of one selected from the group consisting of metal silicide, metal oxide, amorphous silicon, crystalline silicon, polycrystalline silicon, and monocrystalline silicon.

5. The semiconductor solid state battery according to claim 4, wherein the N-type semiconductor or the P-type semiconductor comprises capture levels for electrons or holes in a range of $10^{17}$ cm$^{-3}$ to $10^{22}$ cm$^{-3}$ introduced therein.

6. The semiconductor solid state battery according to claim 1, wherein the N-type semiconductor or the P-type semiconductor comprises a capture level for electrons or holes introduced therein.

7. The semiconductor solid state battery according to claim 6, wherein the N-type semiconductor comprises the capture level for the electrons, the capture level being introduced in the range of 50 to 90 taking a band gap of the N-type semiconductor as 100.

8. The semiconductor solid state battery according to claim 7, wherein the N-type semiconductor comprises the capture level for the electrons in a range of $10^{17}$ cm$^{-3}$ to $10^{22}$ cm$^{-3}$.

9. The semiconductor solid state battery according to claim 6, wherein the P-type semiconductor comprises the capture level for the holes, the capture level being introduced in the range of 10 to 50 taking a band gap of the P-type semiconductor as 100.

10. The semiconductor solid state battery according to claim 9, wherein the P-type semiconductor comprises the capture level for the holes in a range of $10^{17}$ cm$^{-3}$ to $10^{22}$ cm$^{-3}$.

11. The semiconductor solid state battery according to claim 1, further comprising a first electrode provided on the N-type semiconductor and a second electrode provided on the P-type semiconductor.

12. The semiconductor solid state battery according to claim 11, further comprising a second insulating layer provided between the N-type semiconductor and the first electrode,
a third insulating layer provided between the P-type semiconductor and the second electrode, or
both the second insulating layer and the third insulating layer.

13. The semiconductor solid state battery according to claim 12, wherein at least one of the second insulating layer and the third insulating layer has a thickness of 30 nm or less and a dielectric constant of 50 or less.

14. The semiconductor solid state battery according to claim 13, wherein at least one of the second insulating layer and the third insulating layer has a dielectric constant of 10 or less.

15. The semiconductor solid state battery according to claim 1, wherein the N-type semiconductor or the P-type semiconductor comprises capture levels for electrons or holes in a range of $10^{17}$ cm$^{-3}$ to $10^{22}$ cm$^{-3}$ introduced therein.

16. A semiconductor solid state battery comprising:
an N-type semiconductor;
a P-type semiconductor; and
a first insulating layer provided between the N-type semiconductor and the P-type semiconductor, the N-type semiconductor or the P-type semiconductor comprising a capture level for electrons or holes introduced therein.

17. The semiconductor solid state battery according to claim 16, wherein the N-type semiconductor or the P-type semiconductor comprises the capture levels in a range of $10^{17}$ cm$^{-3}$ to $10^{22}$ cm$^{-3}$.

18. A semiconductor solid state battery comprising:
an N-type semiconductor;
a P-type semiconductor;
a first insulating layer provided between the N-type semiconductor and the P-type semiconductor;
a first electrode provided on the N-type semiconductor;
a second electrode provided on the P-type semiconductor; and
a second insulating layer provided between the N-type semiconductor and the first electrode, a third insulating layer provided between the P-type semiconductor and the second electrode, or both the second insulating layer and the third insulating layer.

19. The semiconductor solid state battery according to claim 18, wherein at least one of the second insulating layer and the third insulating layer has a thickness of 30 nm or less and a dielectric constant of 50 or less.

20. The semiconductor solid state battery according to claim 19, wherein at least one of the second insulating layer and the third insulating layer has a dielectric constant of 10 or less.

* * * * *